(12) United States Patent
Chun et al.

(10) Patent No.: US 9,887,368 B2
(45) Date of Patent: Feb. 6, 2018

(54) ORGANIC LIGHT-EMITTING DEVICE AND METHOD FOR MANUFACTURING SAME

(71) Applicant: LG CHEM, LTD., Seoul (KR)

(72) Inventors: Minseung Chun, Daejeon (KR); Jungi Jang, Daejeon (KR); Changhwan Shin, Daejeon (KR); Seong So Kim, Paju-si (KR); Hyungjin Lee, Daejeon (KR); Sang Young Jeon, Daejeon (KR); Chang Hwan Kim, Daejeon (KR); Dong Sik Kim, Daejeon (KR)

(73) Assignee: LG CHEM, LTD., Seoul (KR)

( * ) Notice: Subject to any disclaimer, the term of this patent is extended or adjusted under 35 U.S.C. 154(b) by 135 days.

(21) Appl. No.: 14/113,784

(22) PCT Filed: Oct. 5, 2012

(86) PCT No.: PCT/KR2012/008062
§ 371 (c)(1),
(2) Date: Oct. 24, 2013

(87) PCT Pub. No.: WO2013/051875
PCT Pub. Date: Apr. 11, 2013

(65) Prior Publication Data
US 2014/0048792 A1 Feb. 20, 2014

(30) Foreign Application Priority Data
Oct. 5, 2011 (KR) .................. 10-2011-0101513

(51) Int. Cl.
| | |
|---|---|
| H01L 51/54 | (2006.01) |
| C09K 11/06 | (2006.01) |
| H01L 51/00 | (2006.01) |
| H01L 51/50 | (2006.01) |

(52) U.S. Cl.
CPC ...... H01L 51/0072 (2013.01); H01L 51/0058 (2013.01); H01L 51/0071 (2013.01); H01L 51/0077 (2013.01); H01L 51/0052 (2013.01); H01L 51/50 (2013.01)

(58) Field of Classification Search
None
See application file for complete search history.

(56) References Cited

U.S. PATENT DOCUMENTS

| | | | | |
|---|---|---|---|---|
| 6,396,209 | B1* | 5/2002 | Kido et al. | 313/504 |
| 2006/0269782 | A1* | 11/2006 | Liao et al. | 428/690 |
| 2007/0131929 | A1* | 6/2007 | Bae et al. | 257/40 |
| 2008/0241518 | A1* | 10/2008 | Satou et al. | 428/332 |
| 2008/0311427 | A1 | 12/2008 | Shin et al. | |
| 2009/0189521 | A1 | 7/2009 | Chun et al. | |
| 2011/0095282 | A1 | 4/2011 | Pflumm et al. | |
| 2011/0121268 | A1 | 5/2011 | Nagao et al. | |
| 2011/0127513 | A1* | 6/2011 | Lee et al. | 257/40 |
| 2011/0215308 | A1 | 9/2011 | Im et al. | |
| 2012/0261651 | A1 | 10/2012 | Noto et al. | |

FOREIGN PATENT DOCUMENTS

| | | |
|---|---|---|
| CN | 1261760 A | 8/2000 |
| CN | 101499517 A | 8/2009 |
| CN | 102119158 A | 7/2011 |
| JP | 2009177128 A | 8/2009 |
| JP | 2010-027761 A | 2/2010 |
| JP | 2010-278376 A | 12/2010 |
| JP | 2011-014886 A | 1/2011 |
| JP | 2011-187959 A | 9/2011 |
| KR | 1020030018865 A | 3/2003 |
| KR | 1020080079087 A | 8/2008 |
| WO | 2003018712 A1 | 3/2003 |
| WO | 2008-120957 A1 | 10/2008 |
| WO | 2010-001817 A1 | 1/2010 |
| WO | 2010-072300 A1 | 7/2010 |
| WO | 2011/021385 A1 | 2/2011 |

OTHER PUBLICATIONS

"Multifunctional Deep-Blue Emitter Comprising an Anthracene Core and Terminal Triphenylphosphine Oxide Groups"; by Chien et al.; Advanced Functional Materials 2009, 560-566.

* cited by examiner

*Primary Examiner* — Andrew K Bohaty
(74) *Attorney, Agent, or Firm* — Dentons US LLP

(57) ABSTRACT

The present invention provides an organic light emitting device comprising a first electrode, a second electrode, and one or more organic material layers disposed between the first electrode and the second electrode, and having an excellent life-span property by changing a dipole moment of a compound comprised in the organic material layers.

3 Claims, 4 Drawing Sheets

[Figure 1]
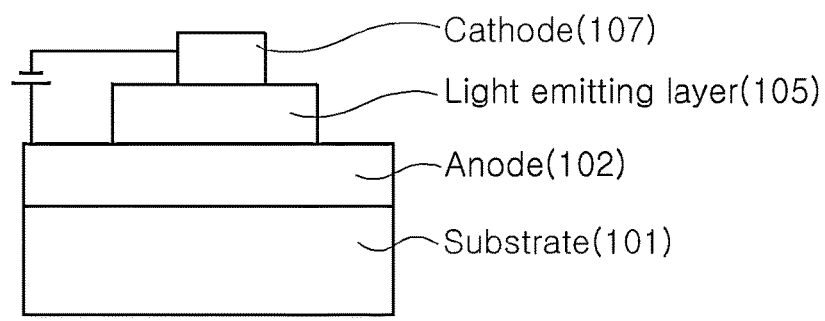
[Figure 2]
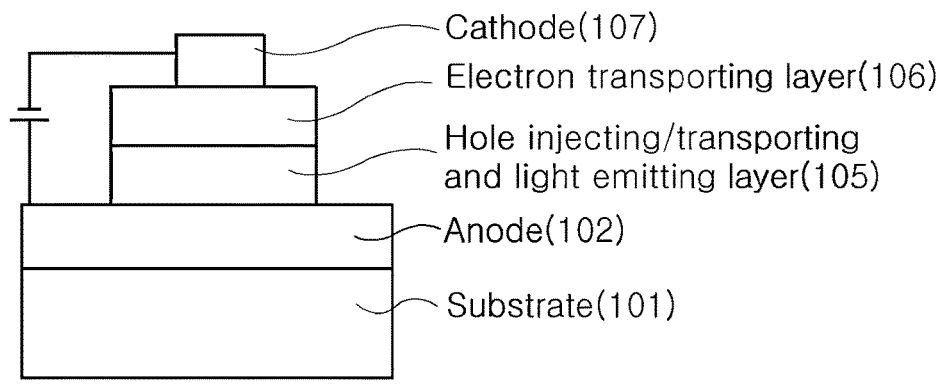

[Figure 3]
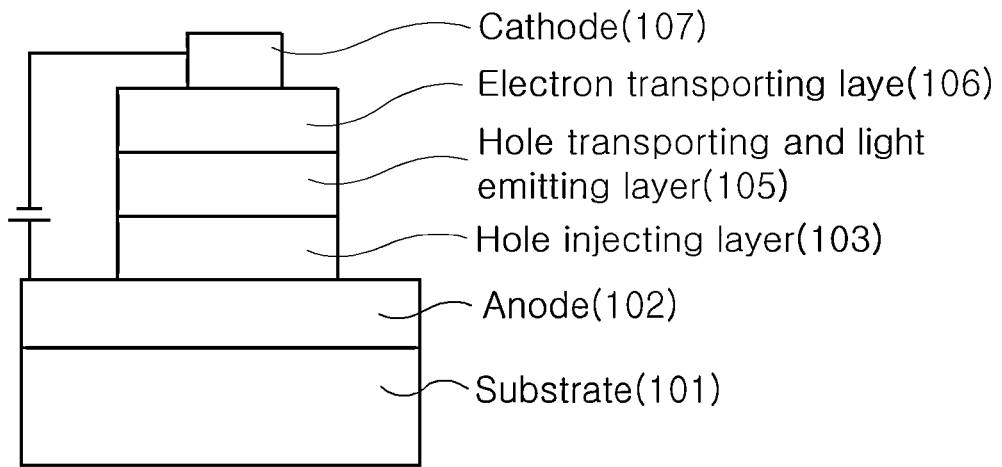
[Figure 4]
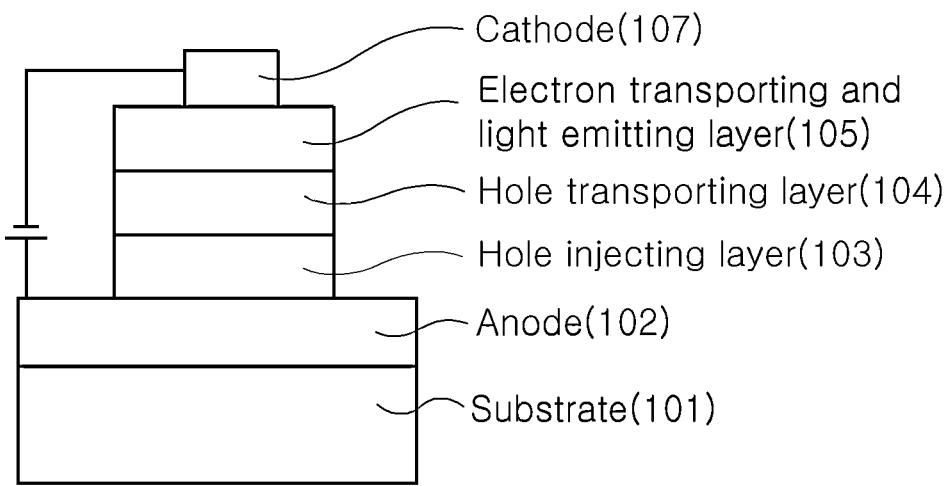

[Figure 5]
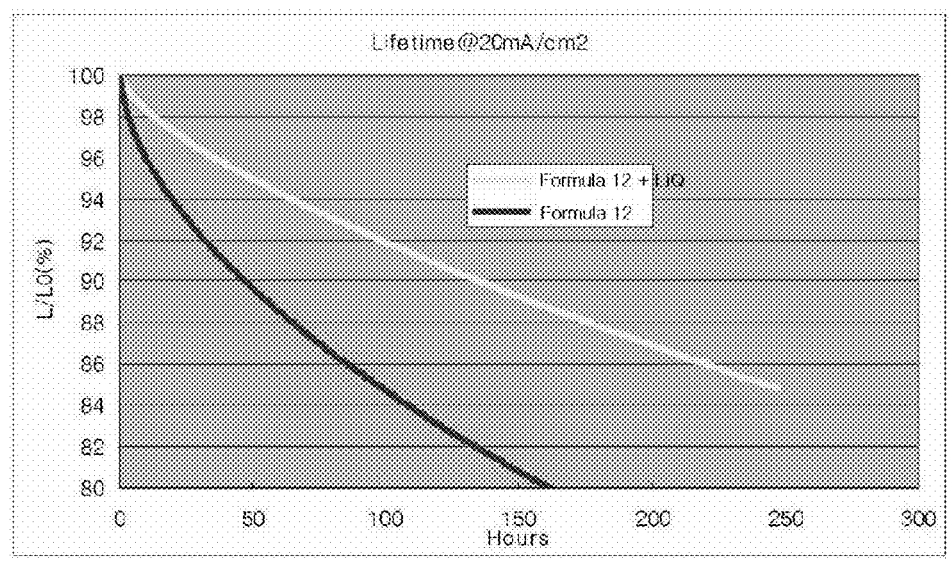

[Figure 6]
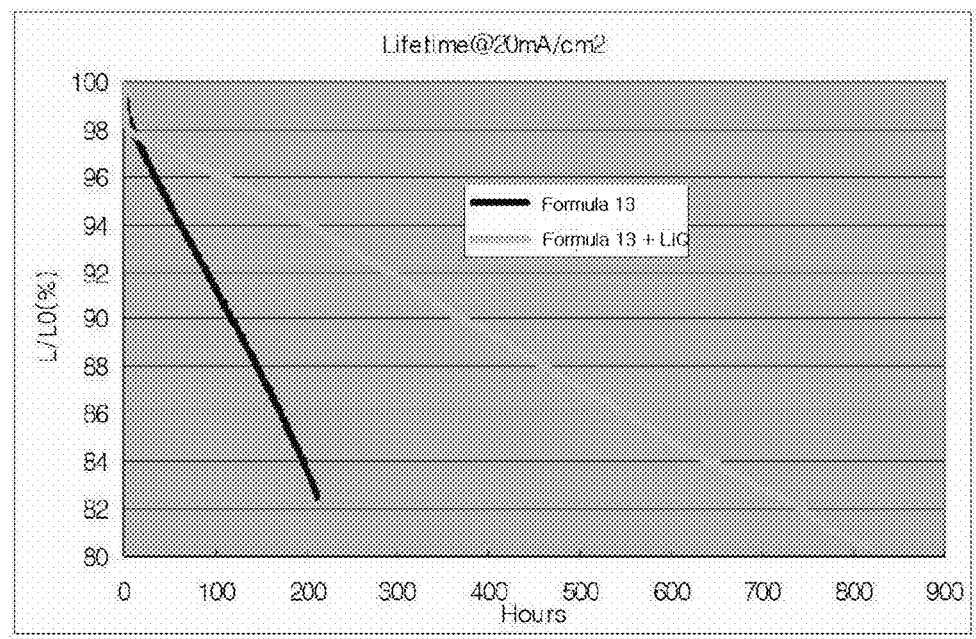

ORGANIC LIGHT-EMITTING DEVICE AND METHOD FOR MANUFACTURING SAME

This application is a national stage application of International Application No. PCT/KR2012/008062, filed on Oct. 5, 2012, which claims priority to and the benefit of Korean Patent Application No. 10-2011-0101513, filed in the Korean Intellectual Property Office on Oct. 5, 2011, the entire contents of which are incorporated herein by reference.

TECHNICAL FIELD

The present invention relates to an organic light emitting device and a method of manufacturing the same.

BACKGROUND ART

An organic light emitting phenomenon is an example of a conversion of current into visible rays by an internal process of a specific organic molecule. The organic light emitting phenomenon is based on the following principle. When an organic material layer is interposed between an anode and a cathode, if voltage is applied between two electrodes, electrons and holes are injected from the cathode and the anode to the organic material layer. The electrons and the holes injected into the organic material layer are recombined to form an exciton, and the exciton is reduced to a bottom state to emit light. The organic light emitting device using the principle may be generally constituted by a cathode, an anode, and an organic material layer interposed therebetween, for example, an organic material layer comprising a hole injection layer, a hole transport layer, a light emitting layer, and an electron transport layer.

The material used in the organic light emitting device is mostly a pure organic material or a complex compound of an organic material and metal, and may be classified into a hole injection material, a hole transport material, a light emitting material, an electron transport material, an electron injection material and the like according to the purpose. Herein, an organic material having a p-type property, that is, an organic material easily oxidized and electrochemically stable while the organic material is oxidized, is mainly used as the hole injection material or the hole transport material. Meanwhile, an organic material having an n-type property, that is, an organic material easily reduced and electrochemically stable while the organic material is reduced, is mainly used as the electron injection material or the electron transport material. A material having both p-type and n-type properties, that is, a material that is stable when the material is oxidized and reduced, is preferable as the light emitting layer material, and a material having high light emitting efficiency for conversion of the exciton into light when the exciton is formed is preferable.

In addition, it is preferable that the material used in the organic light emitting device further have the following properties.

First, it is preferable that the material used in the organic light emitting device have excellent thermal stability. This is because joule heat is generated by movement of electric charges in the organic light emitting device. Recently, since NPB, which has mainly been used as the hole transport layer material, has a glass transition temperature of 100° C. or lower, there is a problem in that it is difficult to apply NPB to an organic light emitting device requiring a high current.

Second, holes or electrons injected into the organic light emitting device should be smoothly transported to a light emitting layer, and the injected holes and electrons should not be released out of the light emitting layer in order to obtain an organic light emitting device that is capable of being driven at low voltage and has high efficiency. To this end, a material used in the organic light emitting device should have an appropriate band gap and HOMO or LUMO energy level. In the case of PEDOT:PSS currently used as a hole transport material in an organic light emitting device manufactured by a solution coating method, since a LUMO energy level thereof is lower than that of an organic material used as a light emitting layer material, it is difficult to manufacture an organic light emitting device having high efficiency and a long life span.

In addition, the material used in the organic light emitting device should have excellent chemical stability, electric charge mobility, and interfacial property with an electrode or an adjacent layer. That is, the material used in the organic light emitting device should be hardly deformed by moisture or oxygen. Further, appropriate hole or electron mobility should be ensured so as to balance densities of the holes and of the electrons in the light emitting layer of the organic light emitting device, thus maximizing formation of excitons. In addition, an interface with an electrode comprising metal or metal oxides should be favorable for stability of the device.

Accordingly, there is a need to develop an organic material having the aforementioned requirements in the art.

DISCLOSURE

Technical Problem

Therefore, the present invention has been made in an effort to provide an organic light emitting device comprising a compound that can satisfy conditions required in a material capable of being used in the organic light emitting device, for example, an appropriate energy level, electrochemical stability, thermal stability and the like, and has a chemical structure performing various roles required in the organic light emitting device according to a substituent group, and a method of increasing a life-span of the organic light emitting device.

Technical Solution

An exemplary embodiment of the present invention provides an organic light emitting device comprising: a first electrode, a second electrode, and one or more organic material layers disposed between the first electrode and the second electrode, wherein one or more layers of the organic material layers comprise a compound where an alkali metal complex is docked to one or more of a hetero atom, a phosphine oxide group, a thioxophosphine group, and a selenoxophosphine group of one or more compounds of a heteroaryl-based compound; and a compound comprising the phosphine oxide group (—P=O), the thioxophosphine group (—P=S), or the selenoxophosphine group (—P=Se).

Another exemplary embodiment of the present invention provides a method of manufacturing an organic light emitting device, comprising: sequentially forming a first electrode, an organic material layer, and a second electrode on a substrate, and forming at least one layer of organic material layers by codepositing one kind or more compounds of compounds comprising a heteroaryl-based compound; and a phosphine oxide group (—P=O), a thioxophosphine group (—P=S), or a selenoxophosphine group (—P=Se) together with an alkali metal complex.

Advantageous Effects

An organic light emitting device according to the present invention comprises a first electrode, a second electrode, and one or more organic material layers disposed between the first electrode and the second electrode, and a life-span property of the organic light emitting device can be largely improved by changing a dipole moment of a compound comprised in the organic material layers.

BRIEF DESCRIPTION OF THE DRAWINGS

FIG. 1 shows an example of a structure of an organic light emitting device, in which an anode 102, a light emitting layer 105, and a cathode 107 are sequentially laminated on a substrate 101.

FIG. 2 shows an example of a structure of an organic light emitting device, in which an anode 102, hole injection/hole transport and light emitting layers 105, an electron transport layer 106, and a cathode 107 are sequentially laminated on a substrate 101.

FIG. 3 shows an example of a structure of an organic light emitting device, in which a substrate 101, an anode 102, a hole injection layer 103, a hole transport and light emitting layer 105, an electron transport layer 106, and a cathode 107 are sequentially laminated.

FIG. 4 shows an example of a structure of an organic light emitting device, in which a substrate 101, an anode 102, a hole injection layer 103, a hole transport layer 104, an electron transport and light emitting layer 105, and a cathode 107 are sequentially laminated.

FIG. 5 is a view showing a life-span property of an organic light emitting device according to Experimental Example 1 of the present invention.

FIG. 6 is a view showing a life-span property of an organic light emitting device according to Experimental Example 2 of the present invention.

BEST MODE

Hereinafter, the present invention will be described in more detail.

An organic light emitting device according to the present invention comprises a first electrode, a second electrode, and one or more organic material layers disposed between the first electrode and the second electrode, wherein one or more layers of the organic material layers comprise a compound where an alkali metal complex is docked to one or more of a hetero atom, a phosphine oxide group, a thioxophosphine group, and a selenoxophosphine group of one or more compounds of a heteroaryl-based compound; and a compound comprising the phosphine oxide group (—P=O), the thioxophosphine group (—P=S), or the selenoxophosphine group (—P=Se).

In the present invention, the compound comprising the phosphine oxide group (—P=O), the thioxophosphine group (—P=S), or the selenoxophosphine group (—P=Se) may be represented by the following Formula 1.

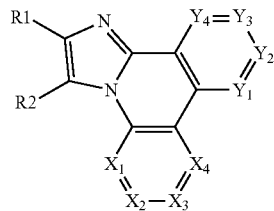

[Formula 1]

In Formula 1, $X_1$ is N or CR3, $X_2$ is N or CR4, $X_3$ is N or CR5, $X_4$ is N or CR6, $Y_1$ is N or CR7, $Y_2$ is N or CR8, $Y_3$ is N or CR9, $Y_4$ is N or CR10, all of $X_1$ to $X_4$ and $Y_1$ to $Y_4$ are not N, R3 to R10 are each independently $-(L)_p-(Y)_q$ or represented by the following Formula 1A, at least one of R3 to R10 is represented by the following Formula 1A, p is an integer of 0 to 10, q is an integer of 1 to 10, and two or more adjacent groups of R3 to R10 may form a monocycle or polycycle,

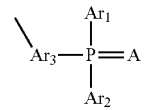

[Formula 1A]

L is oxygen; sulfur; substituted or unsubstituted nitrogen; substituted or unsubstituted phosphorus; a substituted or unsubstituted arylene group; a substituted or unsubstituted alkenylene group; a substituted or unsubstituted fluorenylene group; a substituted or unsubstituted carbazolylene group; or a substituted or unsubstituted heteroarylene group comprising one or more of N, O and S atoms, Y is hydrogen; heavy hydrogen; a halogen group; a nitrile group; a nitro group; a hydroxy group; a substituted or unsubstituted cycloalkyl group; a substituted or unsubstituted alkoxy group; a substituted or unsubstituted aryloxy group; a substituted or unsubstituted alkylthioxy group; a substituted or unsubstituted arylthioxy group; a substituted or unsubstituted alkylsulfoxy group; a substituted or unsubstituted arylsulfoxy group; a substituted or unsubstituted alkenyl group; a substituted or unsubstituted silyl group; a substituted or unsubstituted boron group; a substituted or unsubstituted alkylamine group; a substituted or unsubstituted aralkylamine group; a substituted or unsubstituted arylamine group; a substituted or unsubstituted heteroarylamine group; a substituted or unsubstituted aryl group; a substituted or unsubstituted fluorenyl group; a substituted or unsubstituted carbazole group; or a substituted or unsubstituted heterocycle group comprising one or more of N, O and S atoms, R1 and R2 may be connected to each other to form or not to form a substituted or unsubstituted aliphatic, aromatic or heteroaromatic monocycle or polycycle, and in the case where R1 and R2 does not form the cycle, R1 and R2 are the same as or different from each other and each independently hydrogen, a substituted or unsubstituted $C_3$-$C_{40}$ cycloalkyl group; a substituted or unsubstituted $C_6$-$C_{60}$ aryl group; a substituted or unsubstituted $C_2$-$C_{40}$ alkenyl group; or a substituted or unsubstituted $C_2$-$C_{60}$ heterocycle group, the aromatic or heteroaromatic monocycle and polycycle formed by connecting R1, R2, and R1 and R2 to each other may be each independently substituted by $-(L)_p-(Y)_q$, in the case where two or more L and two or more Y are present, L and Y are each independently the same as or different from each other, A are each independently O, S or Se, $Ar_1$ and $Ar_2$ are each independently a substituted or unsubstituted aryl group; or a substituted or unsubstituted heterocycle group comprising one or more of N, O and S atoms, and $Ar_3$ are each independently a substituted or unsubstituted arylene group; or a substituted or unsubstituted heteroarylene group comprising one or more of N, O and S atoms.

In Formula 1, in the case where R1 and R2 are connected to each other to form one cycle, the compound may be represented by the following Formula 2.

[Formula 2]

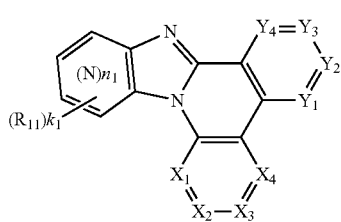

In Formula 2, $X_1$ to $X_4$, and $Y_1$ to $Y_4$ are the same as definitions of the Formula 1, N of $(N)n_1$ means a nitrogen atom and also that the nitrogen atom may replace a carbon atom in a benzene cycle, $n_1$ of $(N)n_1$ is an integer of 0 to 6, $R_{11}$ is the same as definition of R3 to R10 of the Formula 1, and $k_1$ is an integer of 0 to 4.

In Formula 1, in the case where R1 and R2 are connected to each other to form a polycycle of two or more cycles, the compound may be represented by the following Formula 3 or 4.

[Formula 3]

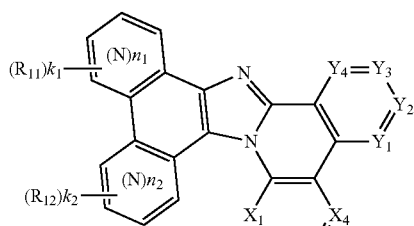

[Formula 4]

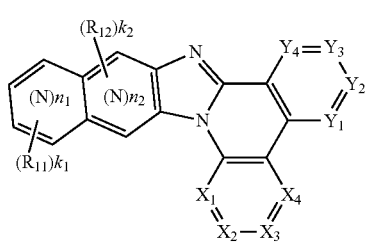

In Formulas 3 and 4, $X_1$ to $X_4$, and $Y_1$ to $Y_4$ are the same as definitions of the Formula 1, N of $(N)n_1$ and $(N)n_2$ means a nitrogen atom and also that the nitrogen atom may replace a carbon atom in a benzene cycle, $n_1$ of $(N)n_1$ is an integer of 0 to 2, $n_2$ of $(N)n_2$ is an integer of 0 to 2, $R_{11}$ and $R_{12}$ are each independently the same as definitions of R3 to R10 of the Formula 1, $k_1$ is an integer of 0 to 4, and $k_2$ is an integer of 0 to 4.

In Formula 1, in the case where R1 and R2 do not form a cycle, R1 and R2 may be a phenyl group substituted or unsubstituted by $R_{11}$ and $R_{12}$ or a hexagonal heteroaromatic cycle group that is substituted or unsubstituted by $R_{11}$ and $R_{12}$ and comprises a nitrogen (N) atom. For example, Formula 1 may be represented by the following Formula 5.

[Formula 5]

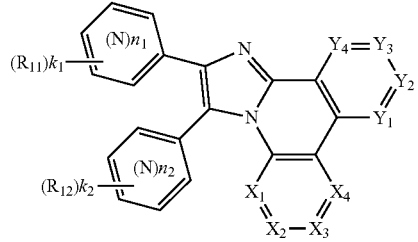

In Formula 5, $X_1$ to $X_4$, and $Y_1$ to $Y_4$ are the same as definitions of the Formula 1, N of $(N)n_1$ and $(N)n_2$ means a nitrogen atom and also that the nitrogen atom may replace a carbon atom in a benzene cycle, $n_1$ of $(N)n_1$ is an integer of 0 to 2, $n_2$ of $(N)n_2$ is an integer of 0 to 2, $R_{11}$ and $R_{12}$ are each independently the same as definitions of R3 to R10 defined in the Formula 1, $k_1$ is an integer of 0 to 4, and $k_2$ is an integer of 0 to 4.

In the present invention, Formula 1 may be represented by the following Formula 6, but is not limited thereto.

[Formula 6]

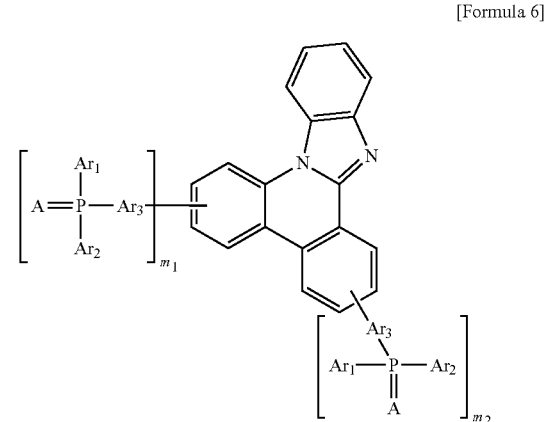

In Formula 6, $Ar_1$ to $Ar_3$, and A are the same as definitions of the Formula 1, $m_1$ is an integer of 0 to 4, and $m_2$ is an integer of 0 to 4, with a proviso that the case where $m_1$ and $m_2$ are both 0 is excluded.

In Formula 1, Ar₃ may be a substituted or unsubstituted arylene group selected from the group consisting of a phenylene group, a biphenylene group, a naphthalene group, a binaphthalene group, an anthracene group, a fluorene group, a chrysene group, and a phenanthrene group, but is not limited thereto.

In Formula 1, Ar₃ may be an arylene group selected from the group consisting of the following Structural Formula, but is not limited thereto.

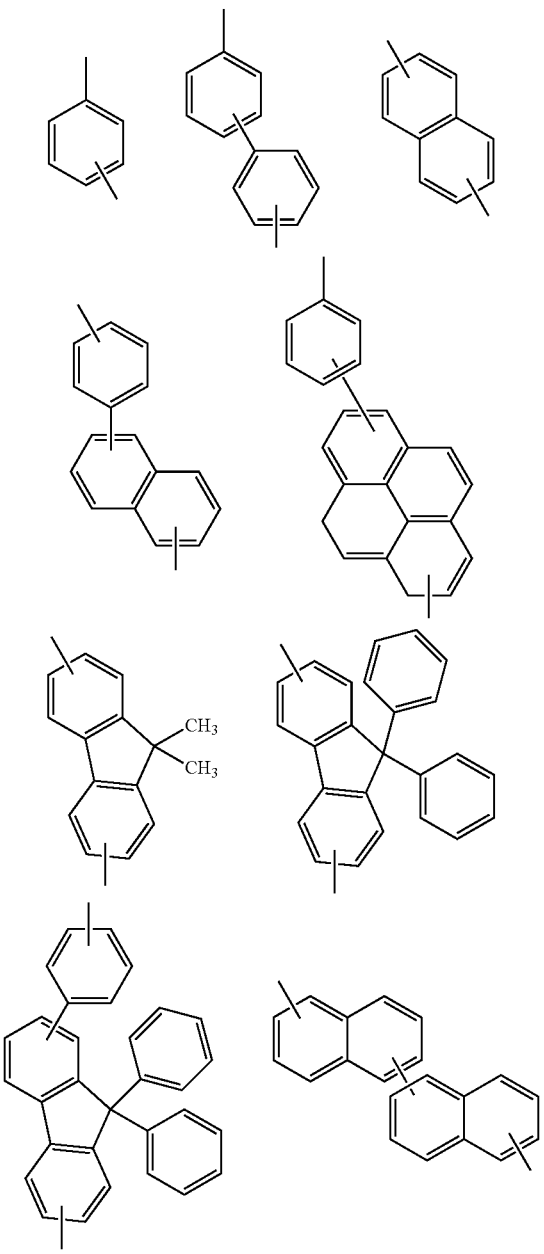

Further, in the present invention, the compound comprising the phosphine oxide group (—P=O), the thioxophosphine group (—P=S), or the selenoxophosphine group (—P=Se) may be represented by the following Formula 7.

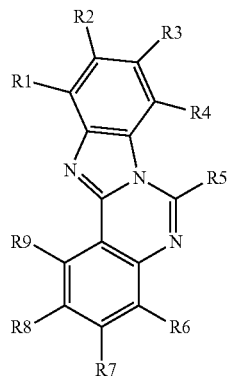

[Formula 7]

In Formula 7, at least one of R1 to R9 is represented by the following Formula 8, and the others are hydrogen; heavy hydrogen; a halogen group; a nitrile group; a nitro group; a hydroxy group; a substituted or unsubstituted cycloalkyl group; a substituted or unsubstituted alkoxy group; a substituted or unsubstituted aryloxy group; a substituted or unsubstituted alkylthioxy group; a substituted or unsubstituted arylthioxy group; a substituted or unsubstituted alkylsulfoxy group; a substituted or unsubstituted arylsulfoxy group; a substituted or unsubstituted alkenyl group; a substituted or unsubstituted silyl group; a substituted or unsubstituted boron group; a substituted or unsubstituted alkylamine group; a substituted or unsubstituted aralkylamine group; a substituted or unsubstituted arylamine group; a substituted or unsubstituted heteroarylamine group; a substituted or unsubstituted aryl group; a substituted or unsubstituted fluorenyl group; a substituted or unsubstituted carbazole group; or a substituted or unsubstituted heterocycle group comprising one or more of N, O and S atoms,

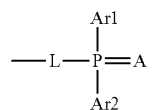

[Formula 8]

In Formula 8,

L is a direct bond; a substituted or unsubstituted arylene group; or a substituted or unsubstituted heteroarylene group comprising one or more of N, O and S atoms, Ar₁ and Ar₂ are each independently a substituted or unsubstituted aryl group; or a substituted or unsubstituted heterocycle group comprising one or more of N, O and S atoms, and A is O, S, or Se.

Further, in the present invention, the compound comprising the phosphine oxide group (—P=O), the thioxophosphine group (—P=S), or the selenoxophosphine group (—P=Se) may be represented by the following Formula 9.

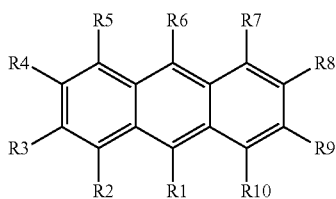

[Formula 9]

In Formula 9,

R1 is a naphthyl group or a biphenyl group, and at least one of R2 to R10 is represented by the following Formula 10, and the others are hydrogen; heavy hydrogen; a halogen group; a nitrile group; a nitro group; a hydroxy group; a substituted or unsubstituted cycloalkyl group; a substituted or unsubstituted alkoxy group; a substituted or unsubstituted aryloxy group; a substituted or unsubstituted alkylthioxy group; a substituted or unsubstituted arylthioxy group; a substituted or unsubstituted alkylsulfoxy group; a substituted or unsubstituted arylsulfoxy group; a substituted or unsubstituted alkenyl group; a substituted or unsubstituted silyl group; a substituted or unsubstituted boron group; a substituted or unsubstituted alkylamine group; a substituted or unsubstituted aralkylamine group; a substituted or unsubstituted arylamine group; a substituted or unsubstituted heteroarylamine group; a substituted or unsubstituted aryl group; a substituted or unsubstituted fluorenyl group; a substituted or unsubstituted carbazole group; or a substituted or unsubstituted heterocycle group comprising one or more of N, O and S atoms,

[Formula 10]

$$—L—\underset{Ar_2}{\overset{Ar_1}{P}}=A$$

In Formula 10,

L is a direct bond; a substituted or unsubstituted arylene group; or a substituted or unsubstituted heteroarylene group comprising one or more of N, O and S atoms, $Ar_1$ and $Ar_2$ are each independently a substituted or unsubstituted aryl group; or a substituted or unsubstituted heterocycle group comprising one or more of N, O and S atoms, and A is O, S, or Se.

In the compound according to the present invention, substituent groups of Formulas 1 to 10 will be described in more detail below.

The alkyl group may be a straight or branched chain, and the number of carbon atoms is not particularly limited but is preferably 1 to 12. Specific examples thereof comprise a methyl group, an ethyl group, a propyl group, an isopropyl group, a butyl group, a t-butyl group, a pentyl group, a hexyl group, a heptyl group and the like, but are not limited thereto.

The alkenyl group may be a straight or branched chain, and the number of carbon atoms is not particularly limited but is preferably 2 to 12. Specific examples thereof comprise an alkenyl group connected to an aryl group such as a stylbenzyl group and a styrenyl group, but are not limited thereto.

The alkynyl group may be a straight or branched chain, and the number of carbon atoms is not particularly limited but is preferably 2 to 12. Specific examples thereof comprise an ethinyl group, a propynyl group and the like, but are not limited thereto.

It is preferable that the cycloalkyl group have the 3 to 12 carbon atoms and do not provide steric hindrance. Specific examples thereof comprise a cyclopentyl group, a cyclohexyl group and the like, but are not limited thereto.

It is preferable that the cycloalkenyl group have 3 to 12 carbon atoms, and more specific examples thereof may comprise a cycle compound having ethenylene in a pentagonal or hexagonal cycle thereof, but are not limited thereto.

It is preferable that the alkoxy group have 1 to 12 carbon atoms, and more specific examples thereof may comprise methoxy, ethoxy, isopropyloxy and the like, but are not limited thereto.

It is preferable that the aryloxy group have 6 to 20 carbon atoms, and more specific examples thereof may comprise phenyloxy, cyclohexyloxy, naphthyloxy, diphenyloxy and the like, but are not limited thereto.

It is preferable that the alkylamine group have 1 to 30 carbon atoms, and more specific examples thereof may comprise a methylamine group, a dimethylamine group, an ethylamine group, a diethylamine group and the like, but are not limited thereto.

It is preferable that the arylamine group have 5 to 30 carbon atoms, and more specific examples thereof comprise a phenylamine group, a naphthylamine group, a biphenylamine group, an anthracenylamine group, a 3-methyl-phenylamine group, a 4-methyl-naphthylamine group, a 2-methyl-biphenylamine group, a 9-methyl-anthracenylamine group, a diphenylamine group, a phenylnaphthyl amine group, a ditolylamine group, a phenyltolylamine group, a triphenylamine group and the like, but are not limited thereto.

The aryl group may be a monocycle or a polycycle, and the number of carbon atoms is not particularly limited but is preferably 6 to 40. Examples of the monocyclic aryl group may comprise a phenyl group, a biphenyl group, a terphenyl group, stilben and the like, and examples of the polycyclic aryl group may comprise a naphthyl group, an anthracenyl group, a phenanthrene group, a pyrenyl group, a perylenyl group, a chrysenyl group and the like, but are not limited thereto.

The heteroaryl group is a heteroatom, a cyclic group comprising O, N, S or P, and the number of carbon atoms is not particularly limited, but is preferably 3 to 30. Examples of the heterocyclic group comprise a carbazole group, a thiophene group, a furan group, a pyrrole group, an imidazole group, a thiazole group, an oxazole group, an oxadiazole group, a triazole group, a pyridyl group, a pyridazine group, a quinolynyl group, an isoquinolynyl group, an acrydyl group and the like, and the compounds of the following Structural Formulas are preferable but are not limited thereto.

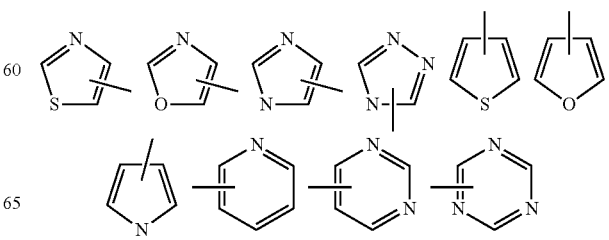

-continued

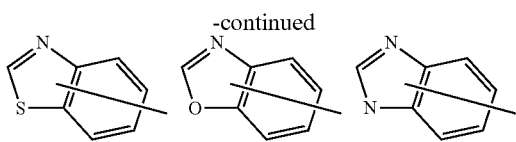

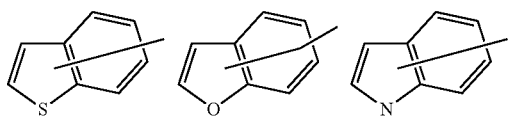

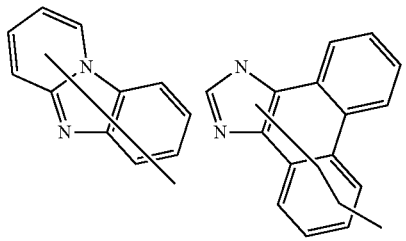

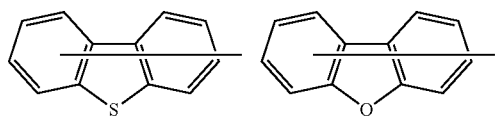

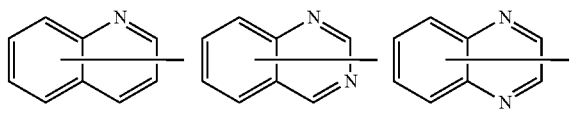

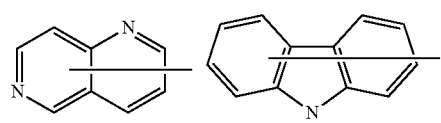

Examples of the halogen group may comprise fluorine, chlorine, bromine, iodine and the like, but are not limited thereto.

Specific examples of the arylene group may comprise a phenylene group, a biphenylene group, a naphthalenyl group, a binaphthalene group, an anthracenylene group, a fluorenylene group, a chrysenylene group, a phenanthrenylene group and the like, but are not limited thereto.

Examples of the heterocycloalkyl group may comprise a cyclic group comprising a heteroatom such as N, S or O.

Further, in the present specification, the term "substituted or unsubstituted" means that substitution is performed by one or more substituent groups selected from the group consisting of heavy hydrogen, a halogen group, an alkyl group, an alkenyl group, an alkoxy group, a silyl group, an arylalkenyl group, an aryl group, a heteroaryl group, a carbazole group, an arylamine group, and a fluorenyl group and a nitrile group substituted or unsubstituted by an aryl group, or there is no substituent group.

The substituents of Formulas 1 to 10 may be further substituted by an additional substituent group, and examples thereof may comprise a halogen group, an alkyl group, an alkenyl group, an alkoxy group, a silyl group, an arylalkenyl group, an aryl group, a heteroaryl group, a carbazole group, an arylamine group, a fluorenyl group substituted or unsubstituted by an aryl group, a nitrile group and the like, but are not limited thereto.

Preferable specific examples of the compound represented by Formula 1 comprise the following compounds, but are not limited thereto.

[Formula 1-1]

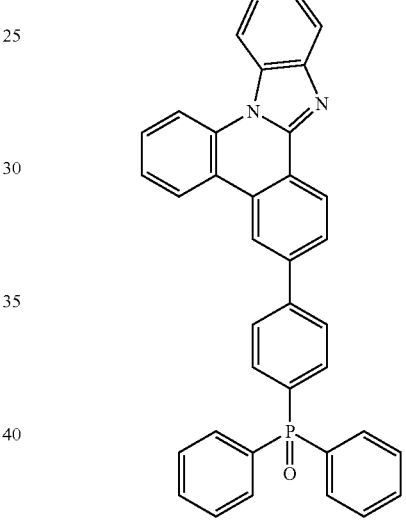

[Formula 1-2]

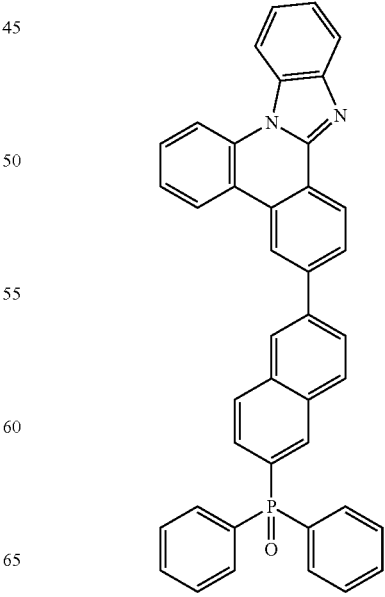

[Formula 1-3]
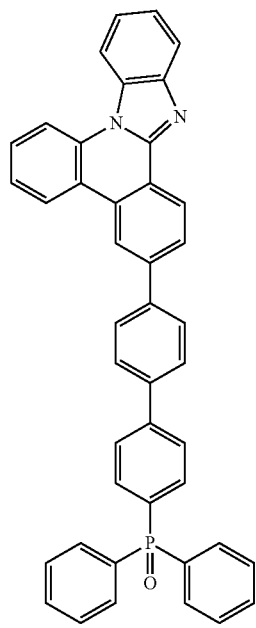
[Formula 1-4]
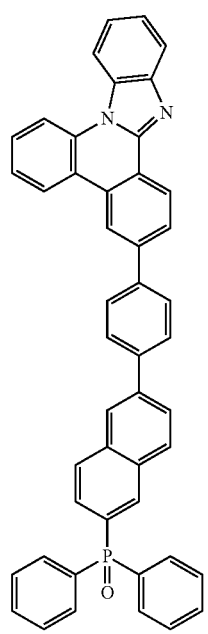
[Formula 1-5]
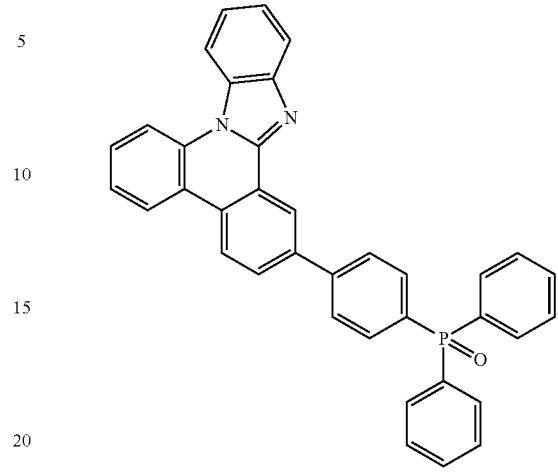
[Formula 1-6]
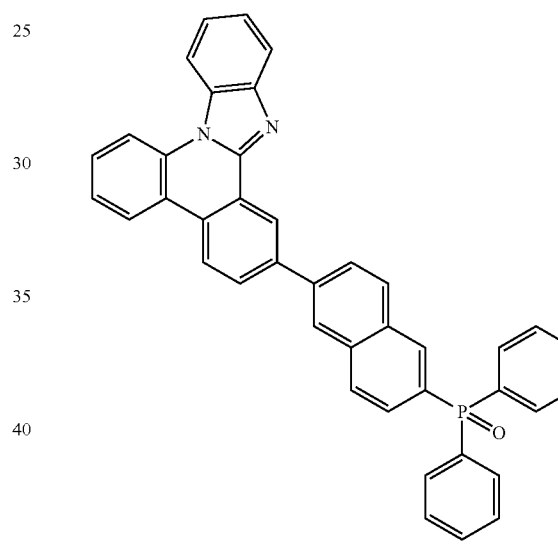
[Formula 1-7]
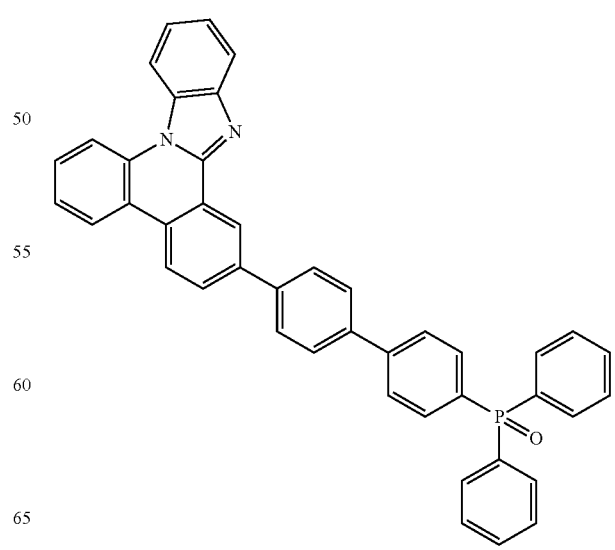

[Formula 1-8]
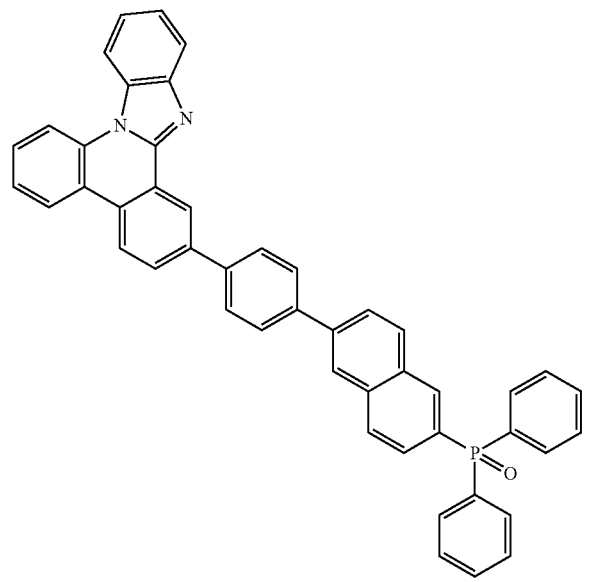
[Formula 1-9]
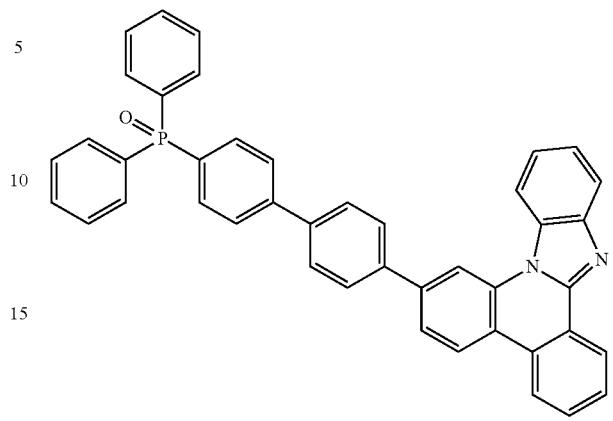
[Formula 1-10]
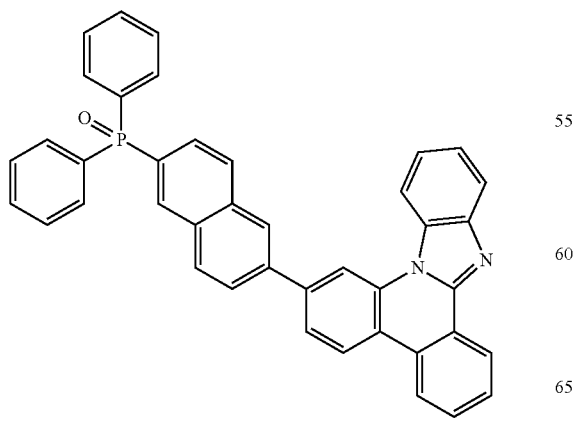
[Formula 1-11]
[Formula 1-12]
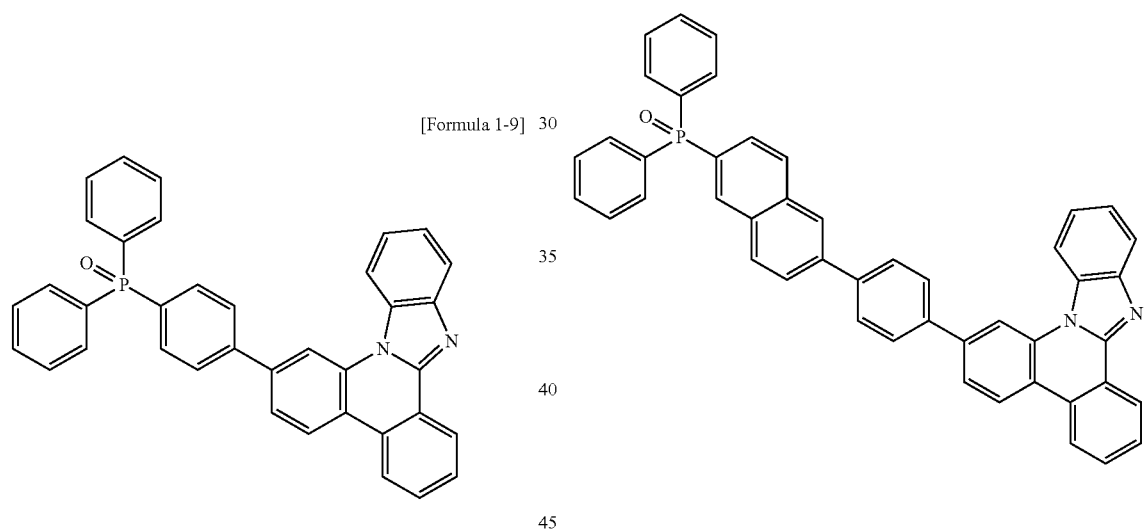
[Formula 1-13]
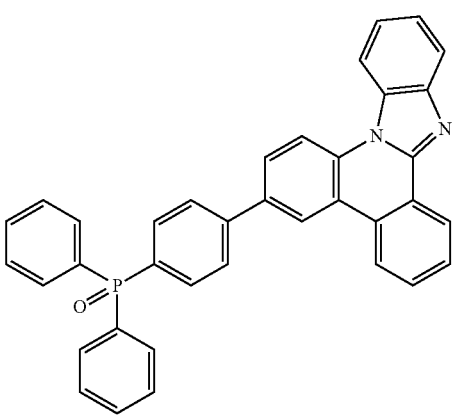

[Formula 1-14]
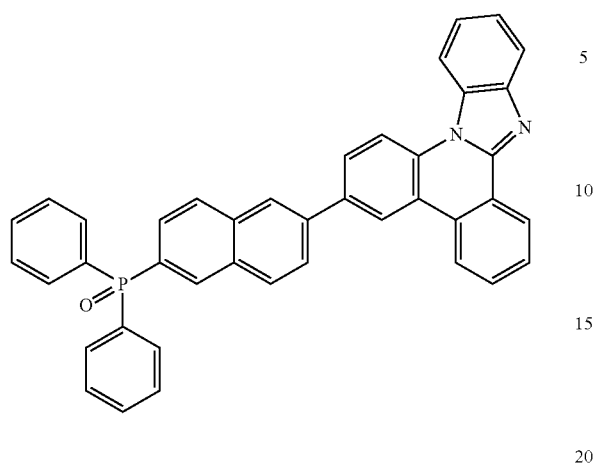
[Formula 1-15]
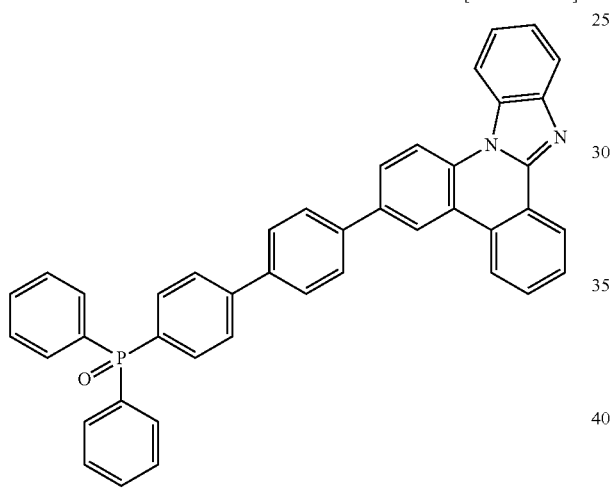
[Formula 1-16]
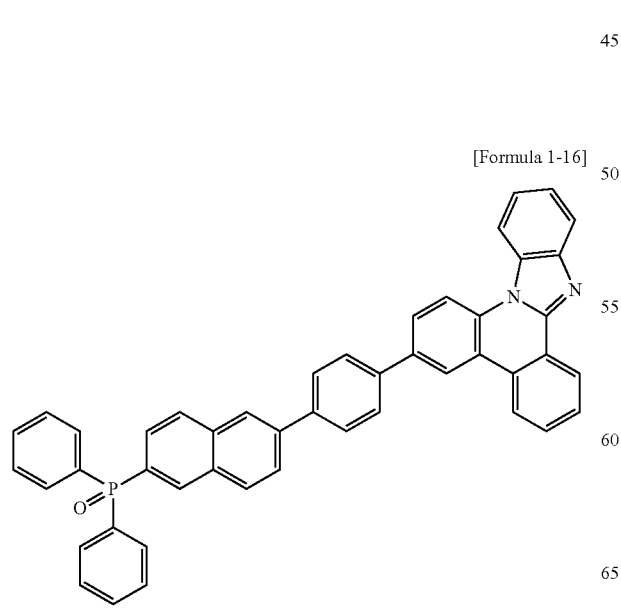
[Formula 1-17]
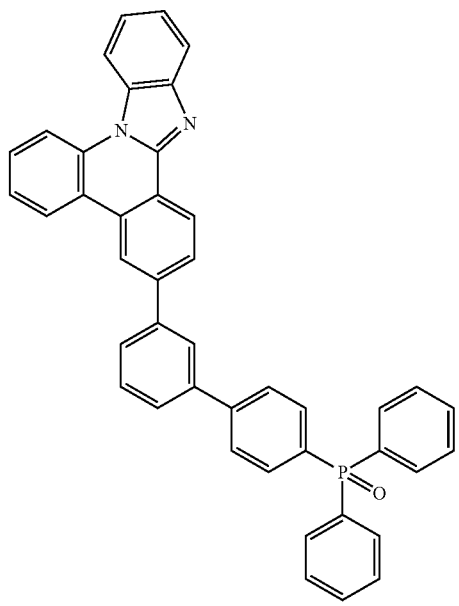
[Formula 1-18]
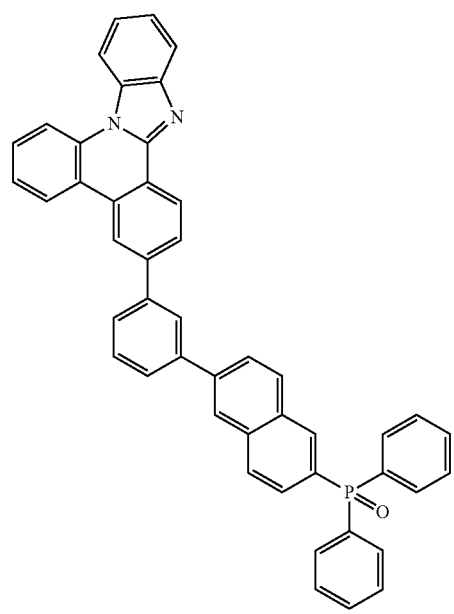

[Formula 1-19]
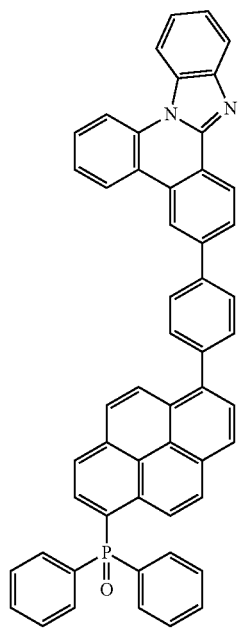
[Formula 1-20]
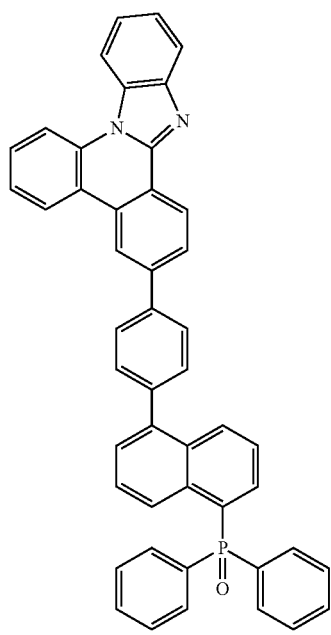
[Formula 1-21]
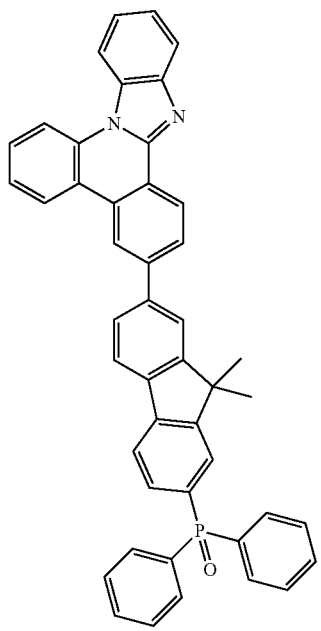
[Formula 1-22]
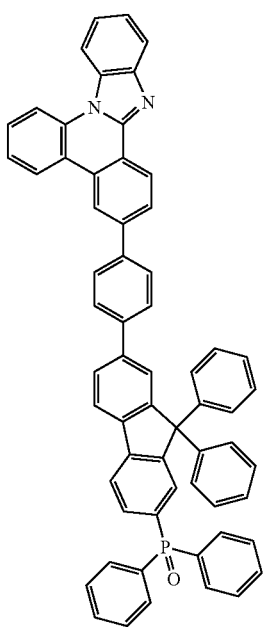

[Formula 1-23]
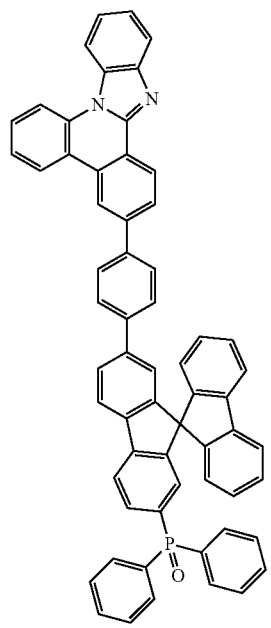
[Formula 1-25]
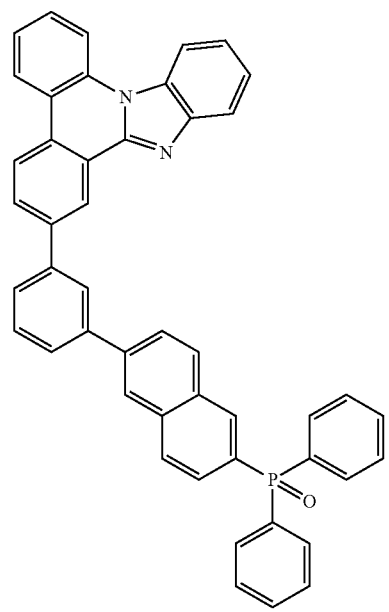
[Formula 1-24]
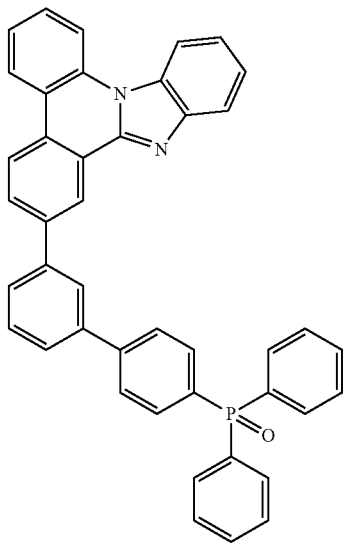
[Formula 1-26]
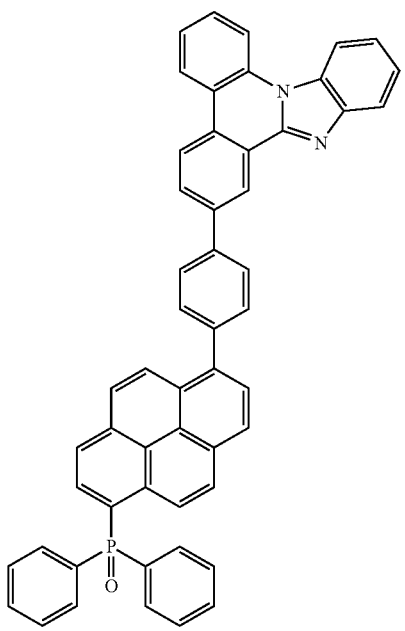

[Formula 1-27]
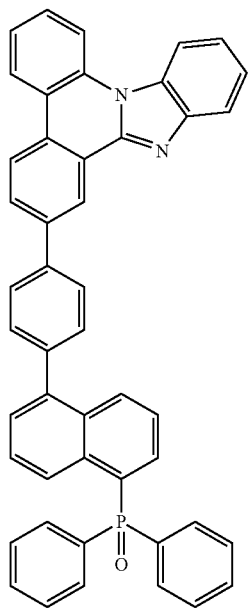
[Formula 1-28]
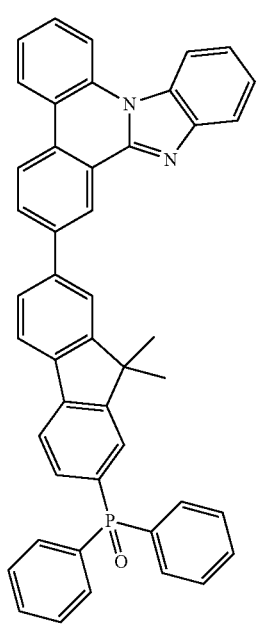
[Formula 1-29]
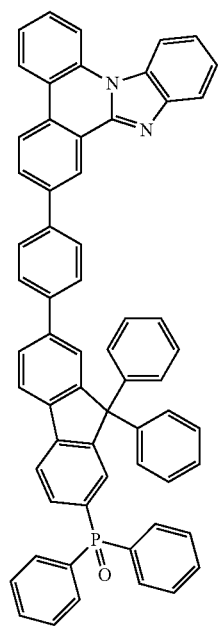
[Formula 1-30]
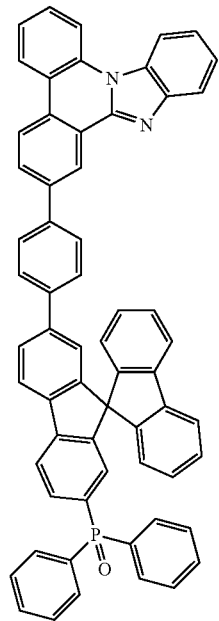

[Formula 1-31]
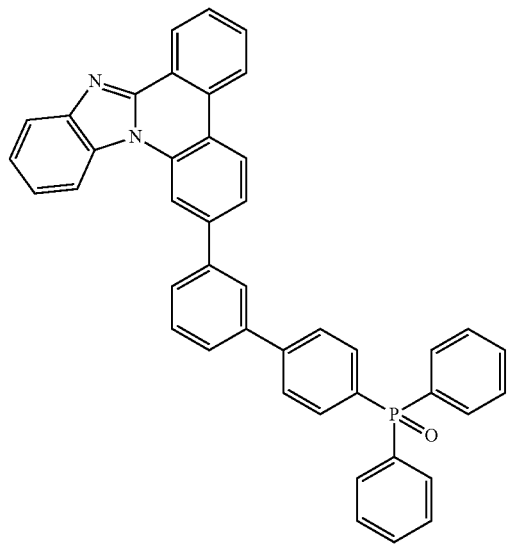
[Formula 1-32]
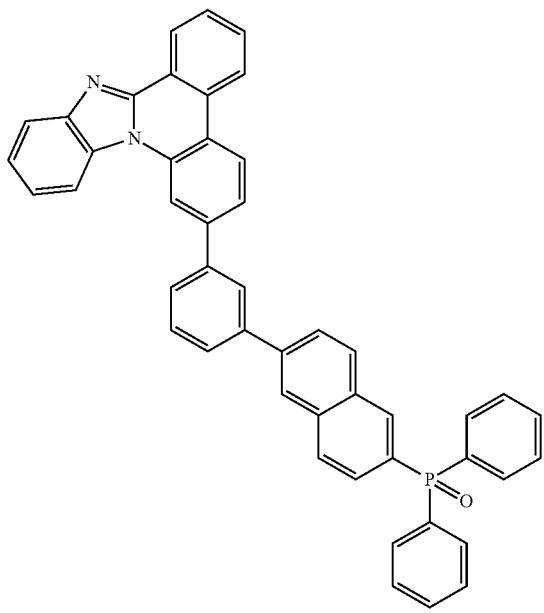
[Formula 1-33]
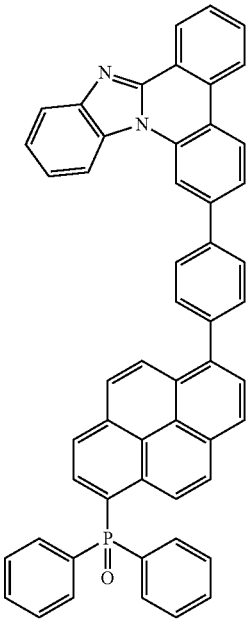
[Formula 1-34]
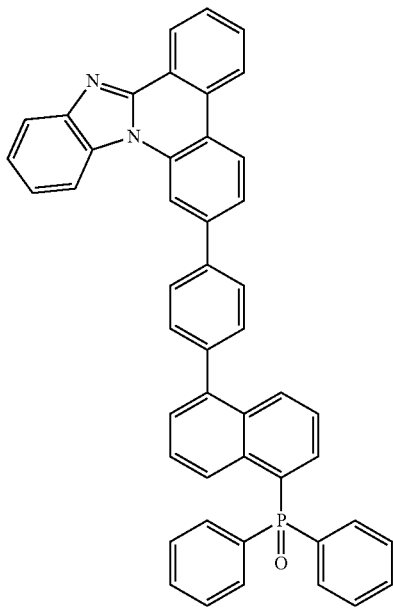

[Formula 1-35]
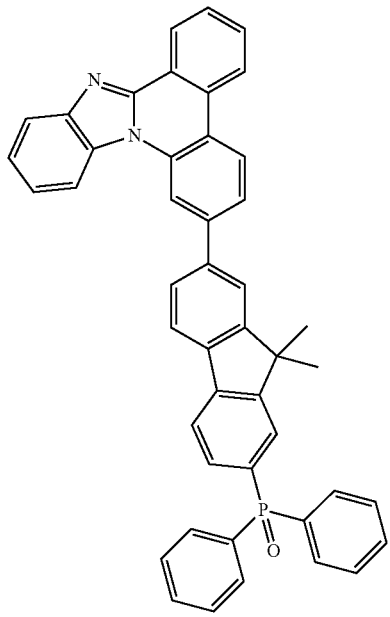
[Formula 1-36]
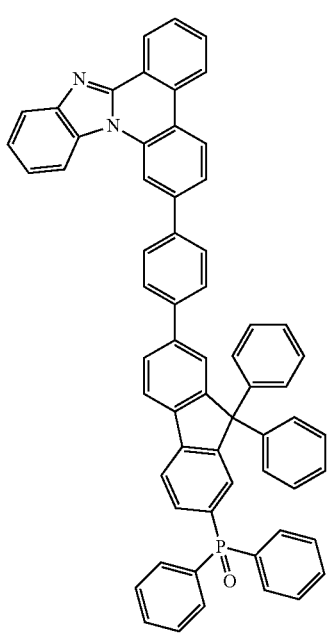
[Formula 1-37]
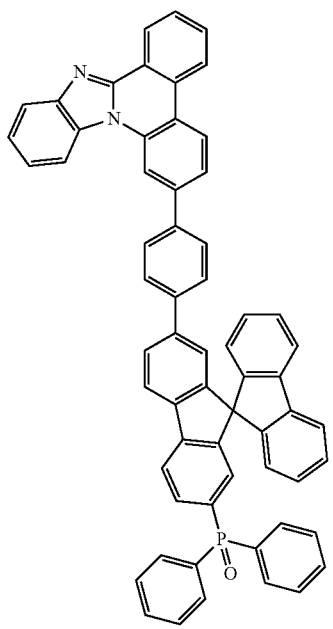
[Formula 1-38]
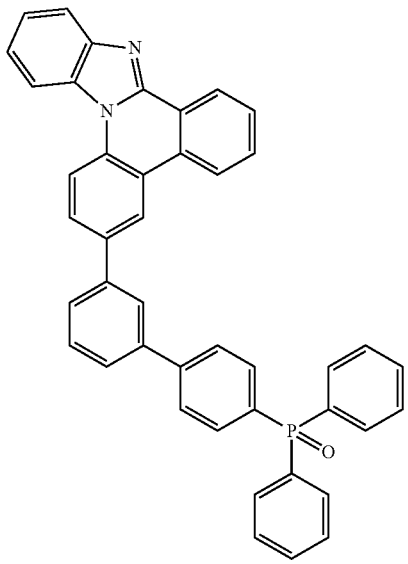

[Formula 1-39]
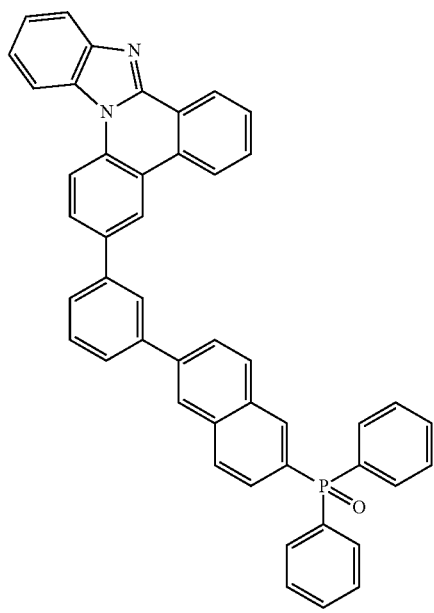
[Formula 1-40]
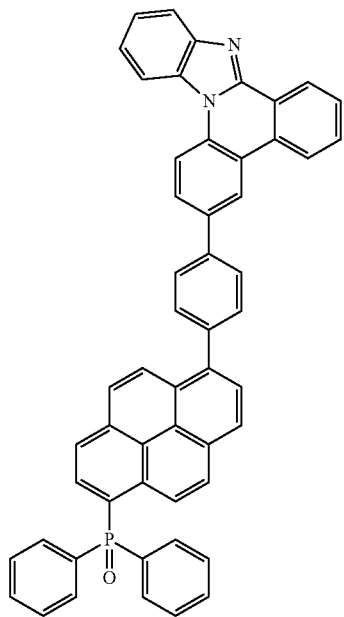
[Formula 1-41]
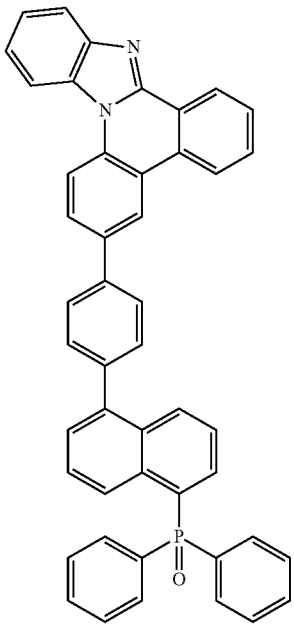
[Formula 1-42]
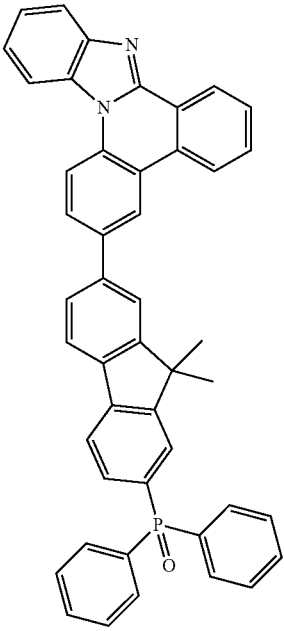

[Formula 1-43]
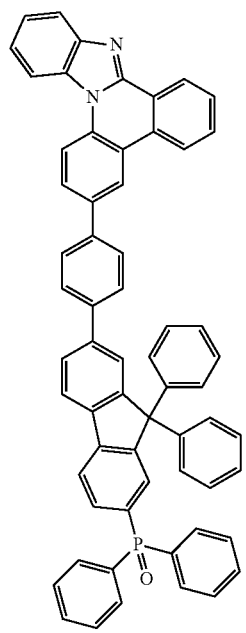
[Formula 1-45]
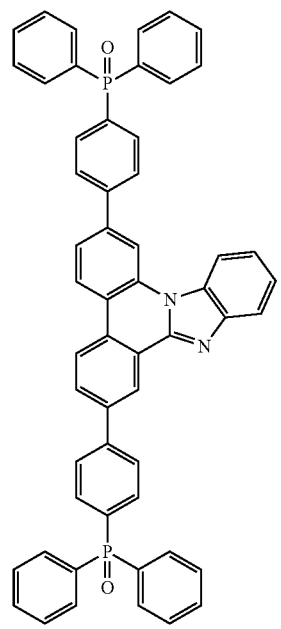
[Formula 1-44]
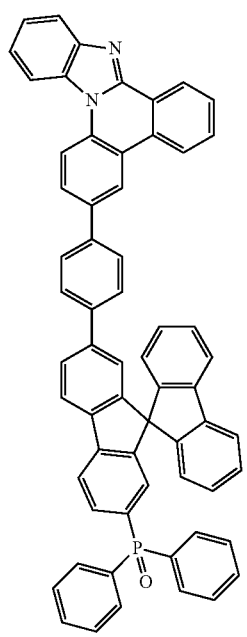
[Formula 1-46]
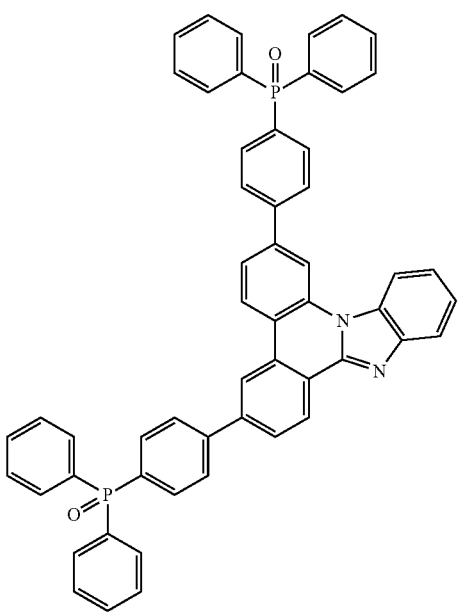

[Formula 1-47]
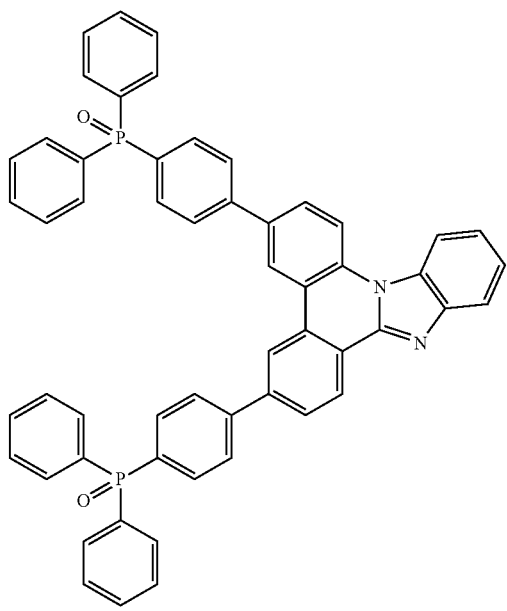
[Formula 1-48]
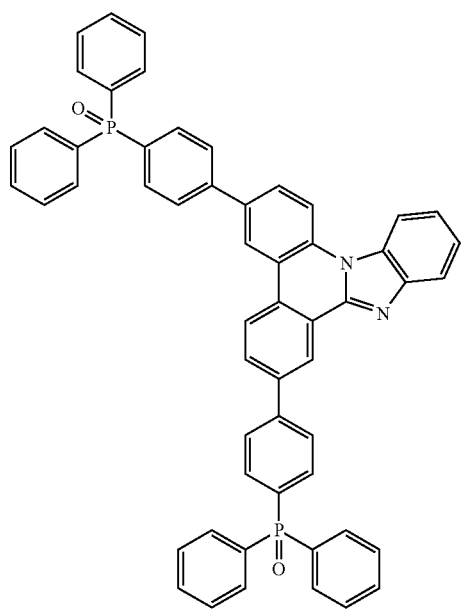
[Formula 1-49]
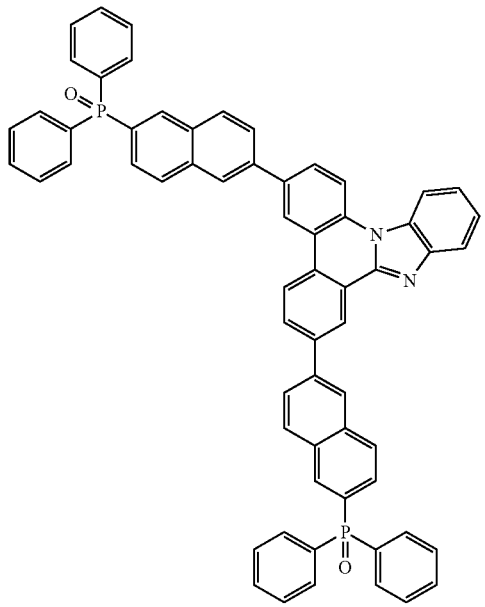
[Formula 1-50]
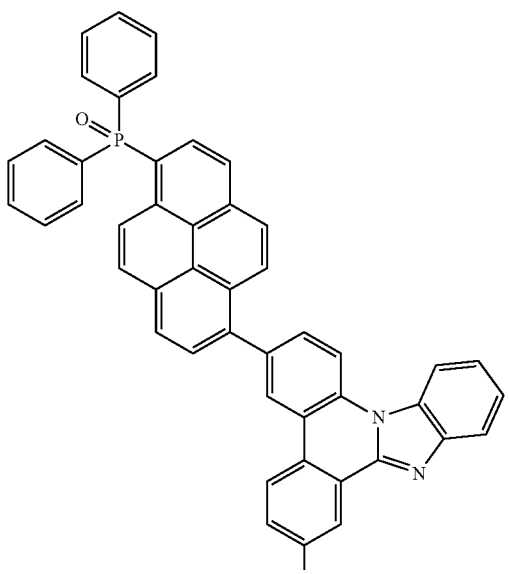
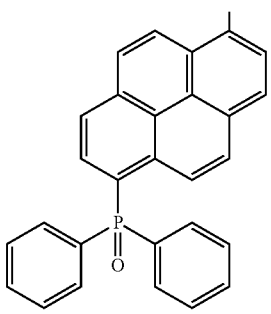

[Formula 1-51]
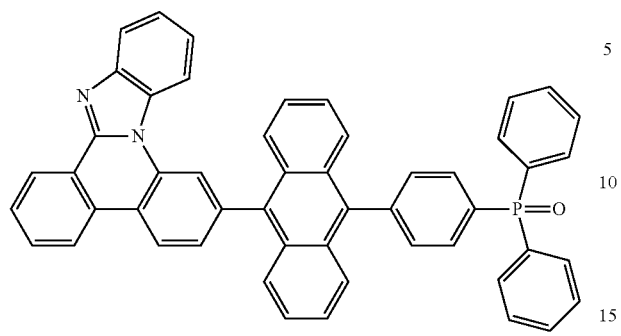
Preferable specific examples of the compound represented by Formula 7 comprise the following compounds, but are not limited thereto.
[Formula 7-1]
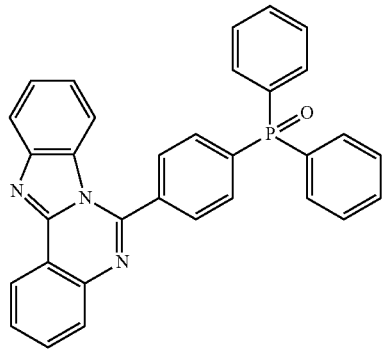
[Formula 7-2]
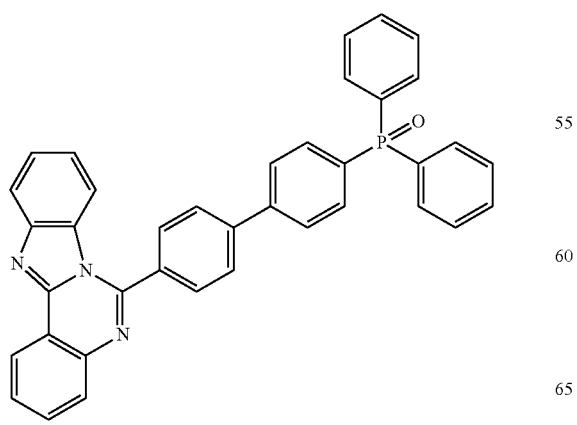
[Formula 7-3]
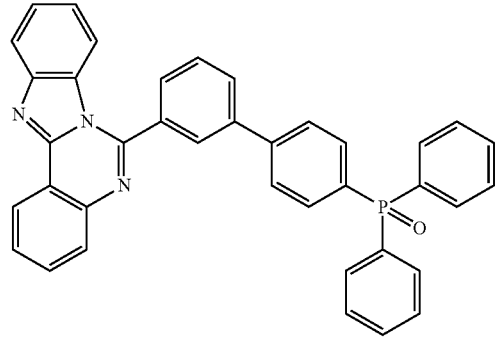
[Formula 7-4]
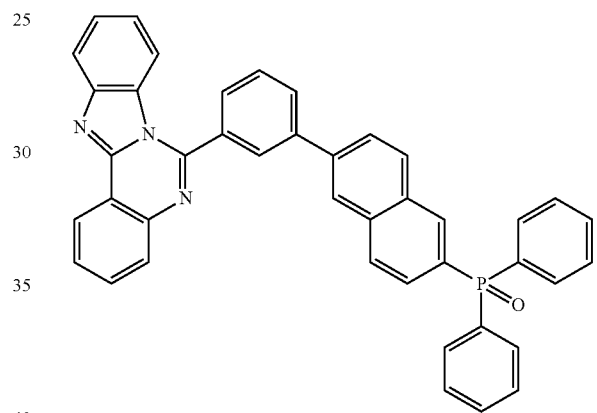
[Formula 7-5]
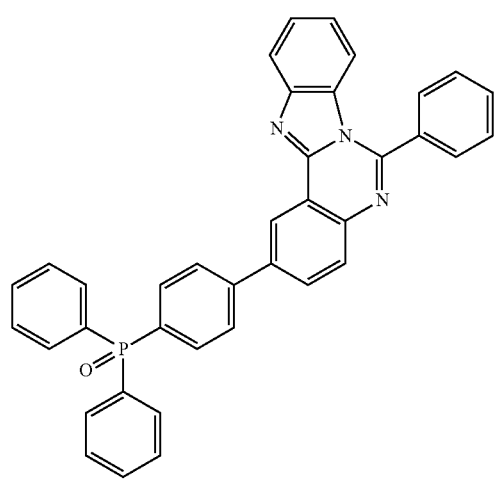

[Formula 7-6]
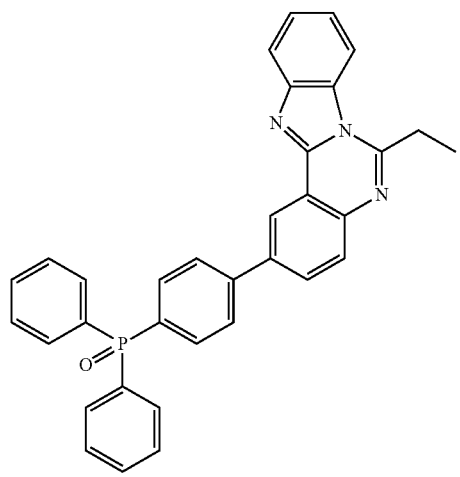
[Formula 7-9]
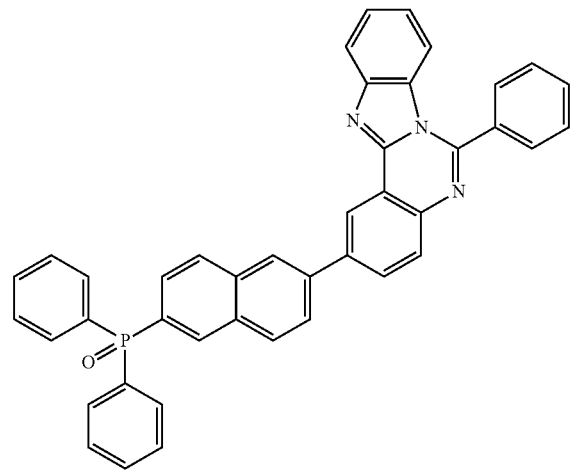
[Formula 7-7]
[Formula 7-10]
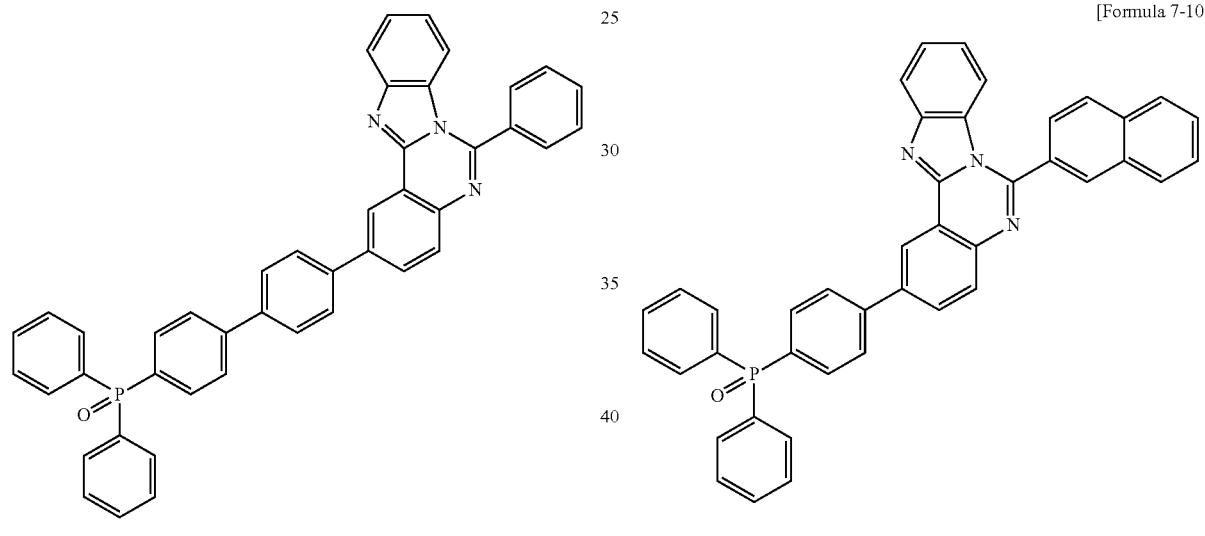
[Formula 7-8]
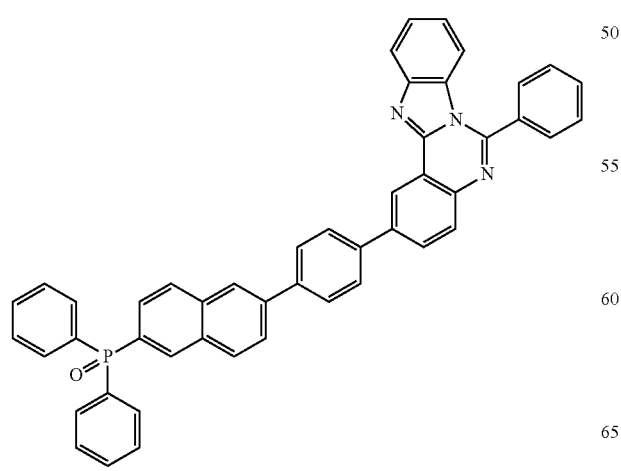
[Formula 7-11]
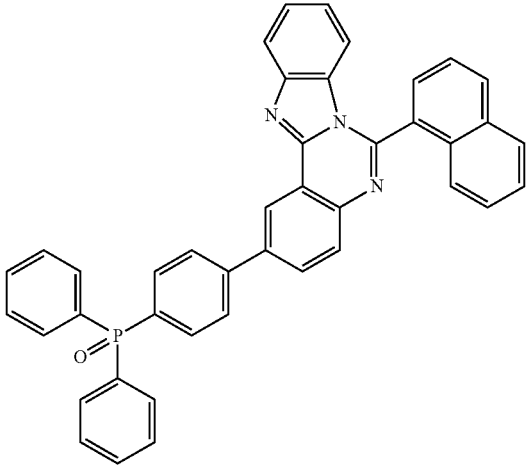

[Formula 7-12]
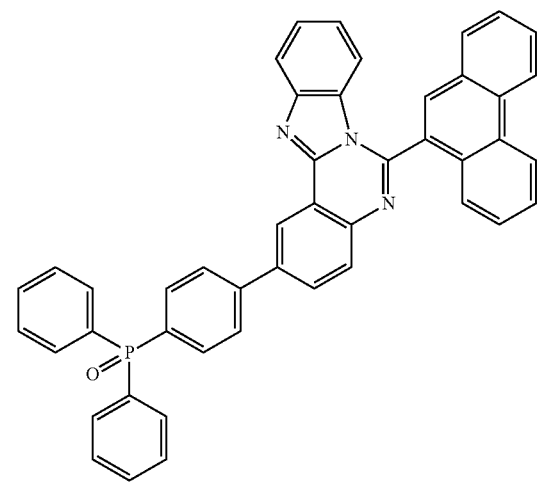
[Formula 7-13]
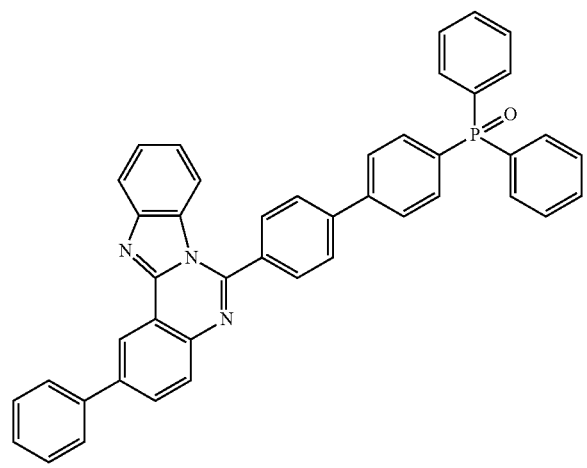
[Formula 7-14]
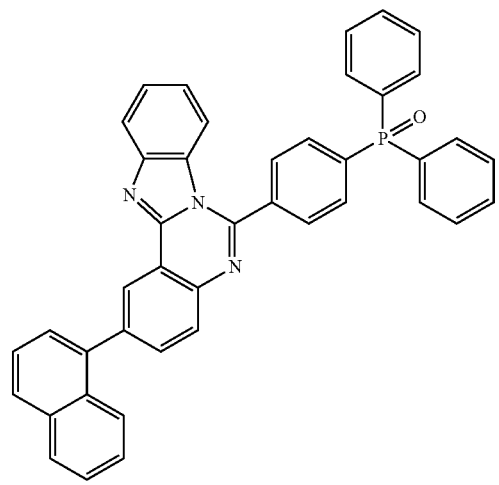
[Formula 7-15]
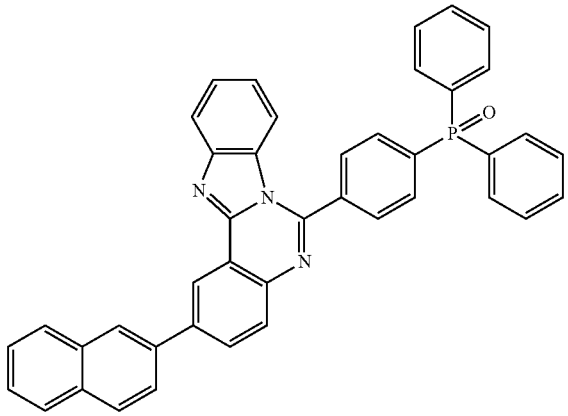
[Formula 7-16]
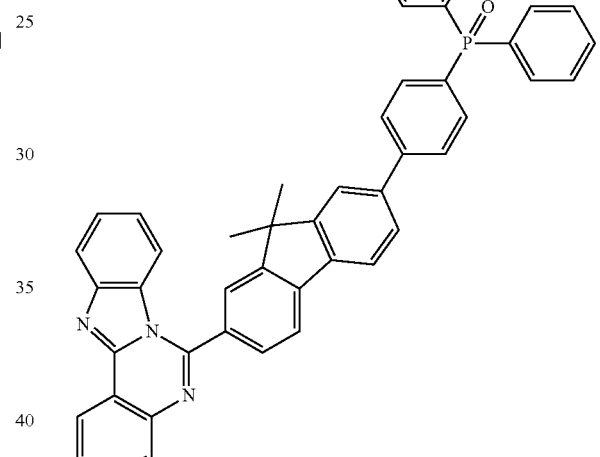
[Formula 7-17]
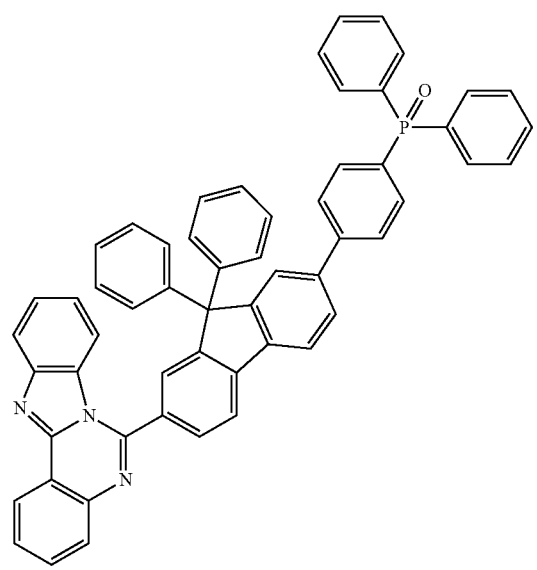

[Formula 7-18]
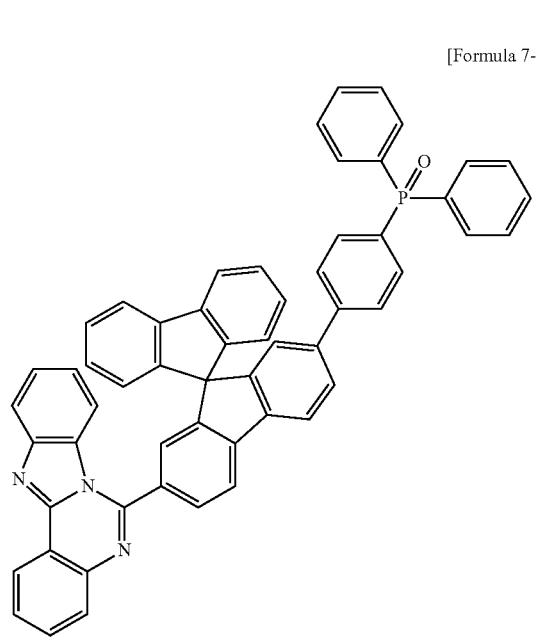
[Formula 7-19]
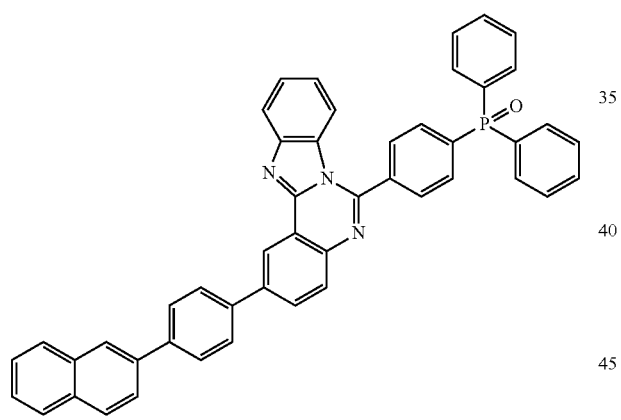
[Formula 7-20]
[Formula 7-21]
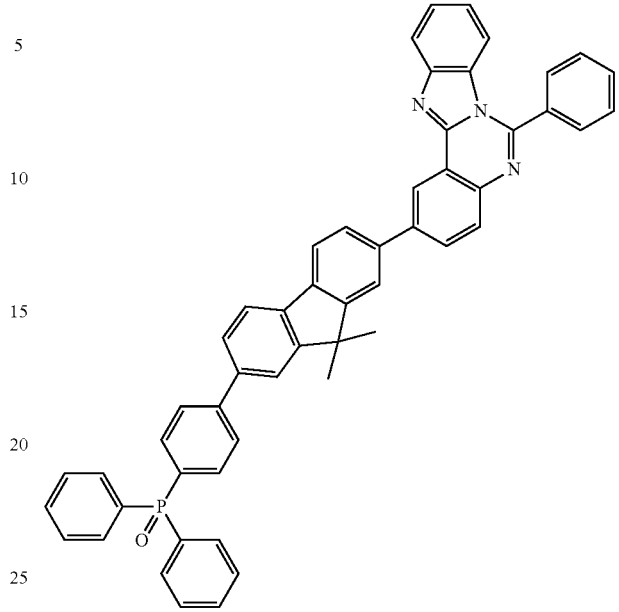
[Formula 7-22]
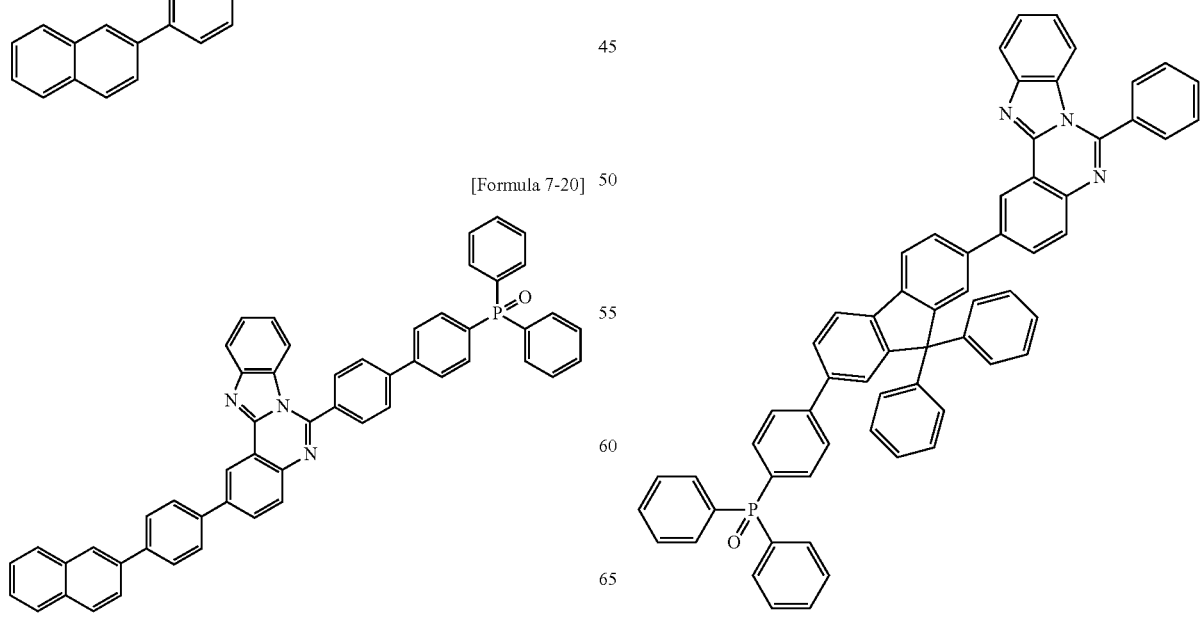

[Formula 7-23]
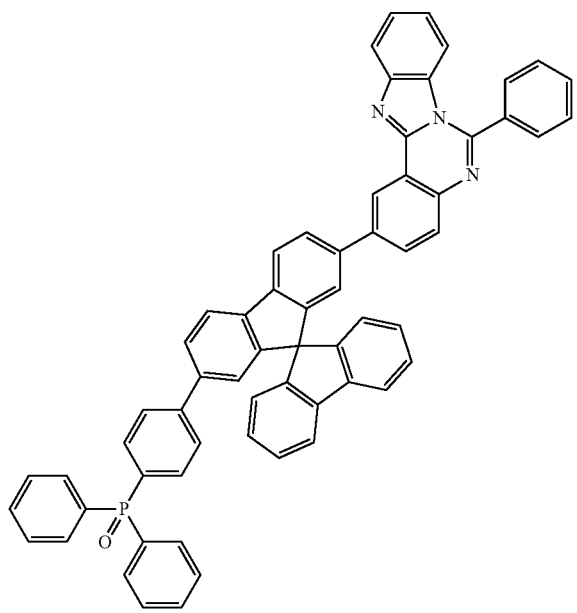
[Formula 7-25]
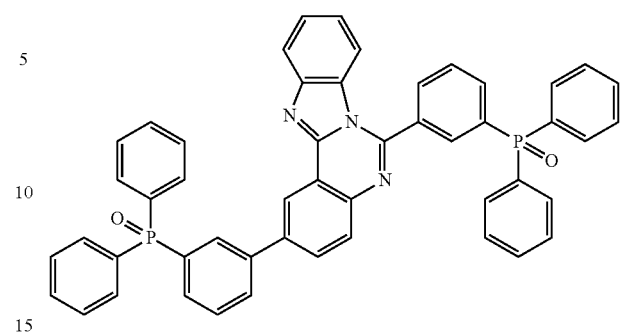
[Formula 7-24]
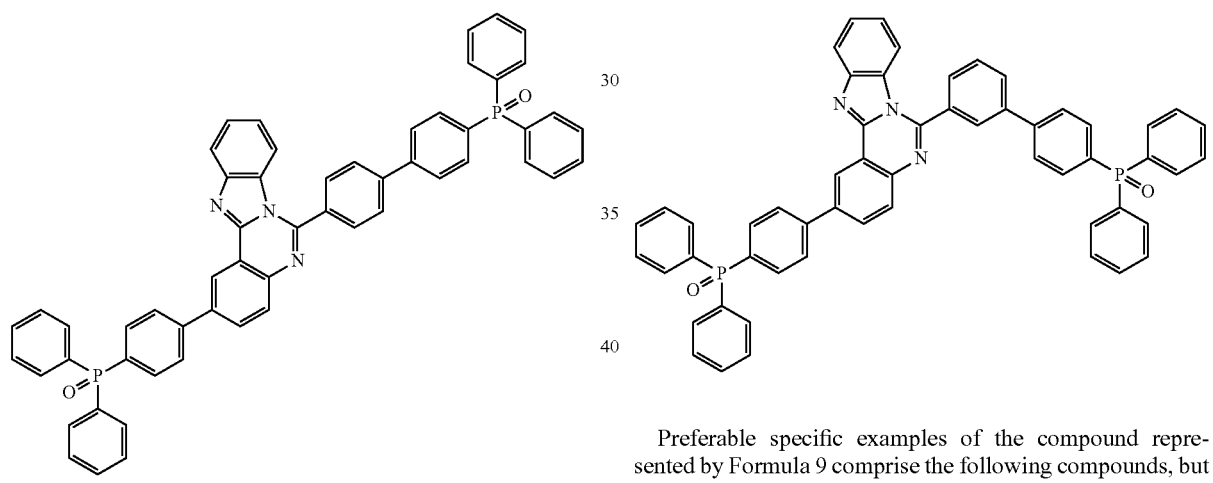
[Formula 7-26]
Preferable specific examples of the compound represented by Formula 9 comprise the following compounds, but are not limited thereto.
[Formula 9-1]
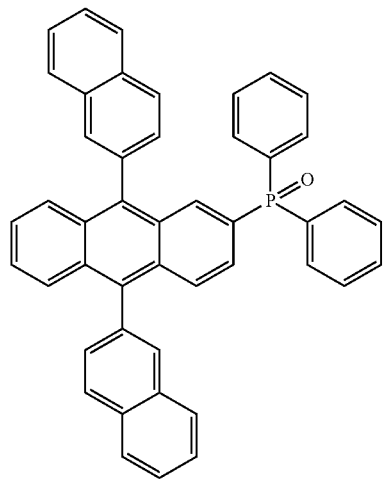
[Formula 9-2]
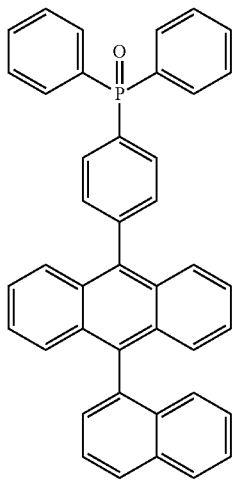

[Formula 9-3]
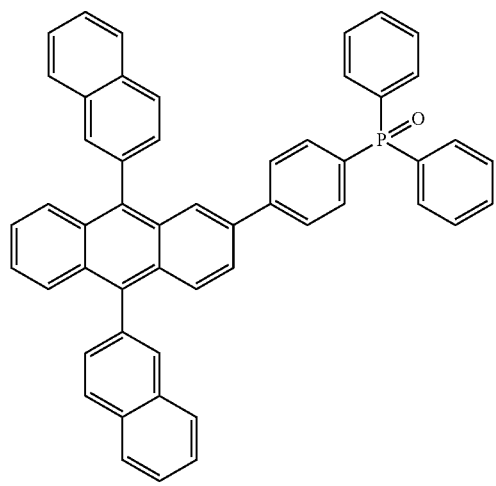
[Formula 9-4]
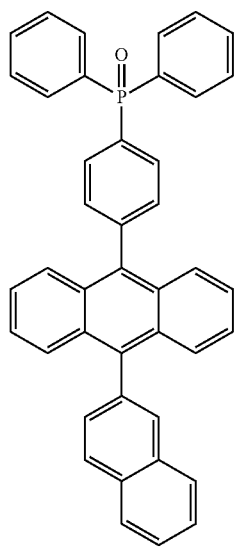
[Formula 9-5]
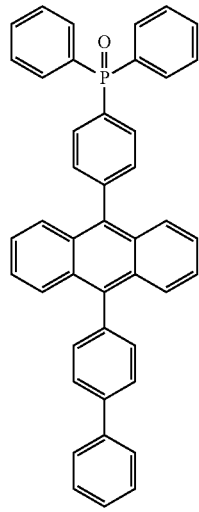
[Formula 9-6]
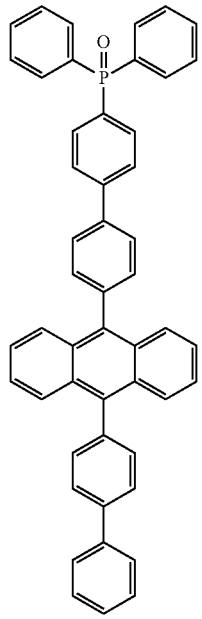

[Formula 9-7]
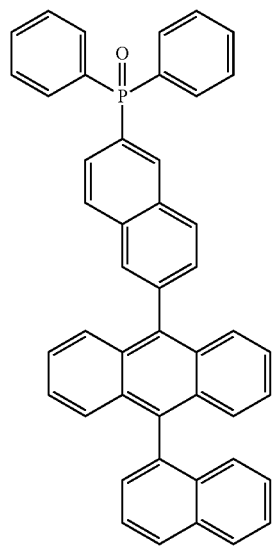
[Formula 9-8]
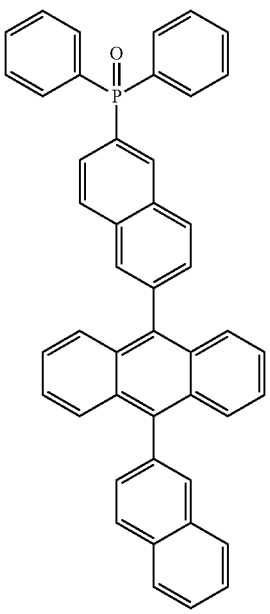
[Formula 9-9]
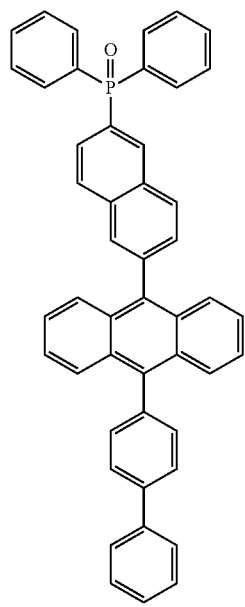
[Formula 9-10]
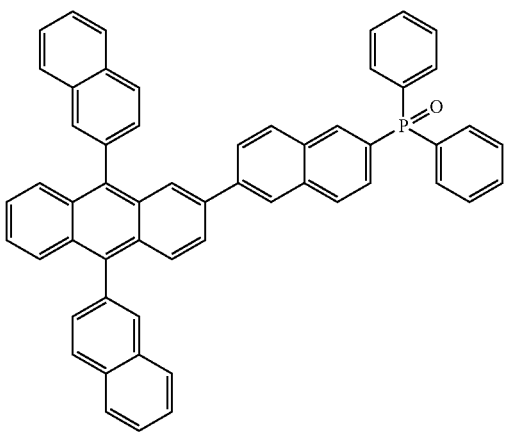

-continued
[Formula 9-11]
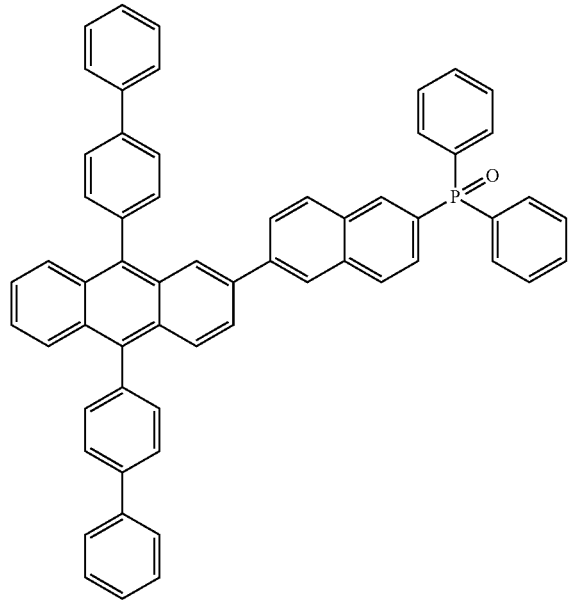
[Formula 9-12]
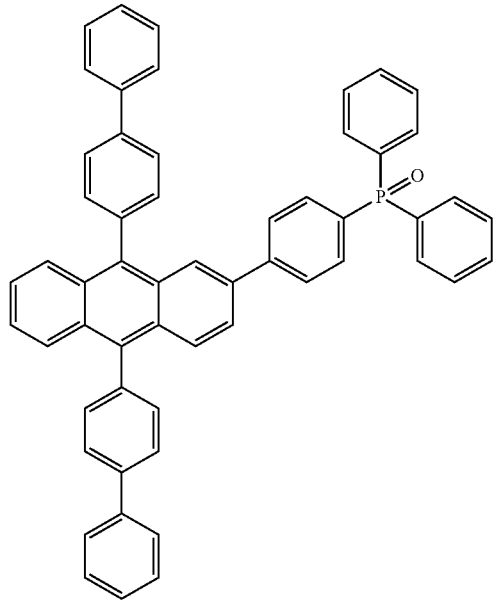
[Formula 9-13]
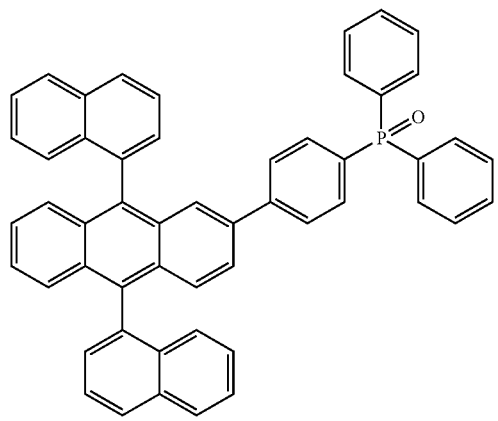
[Formula 9-14]
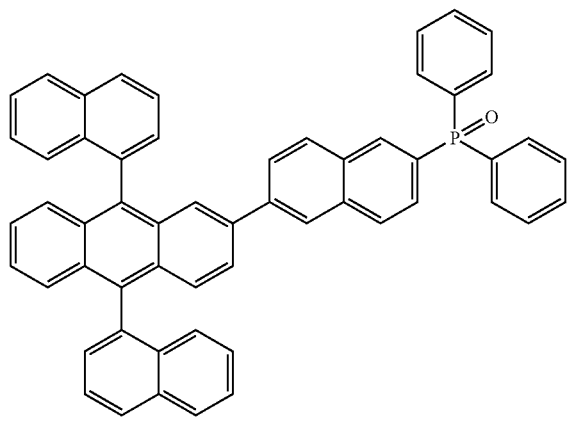
[Formula 9-15]
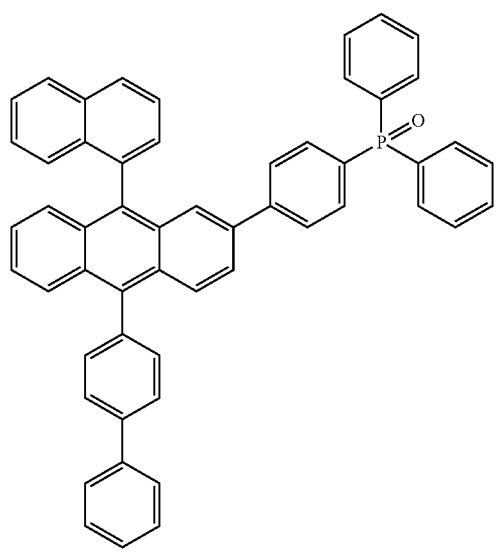
[Formula 9-16]
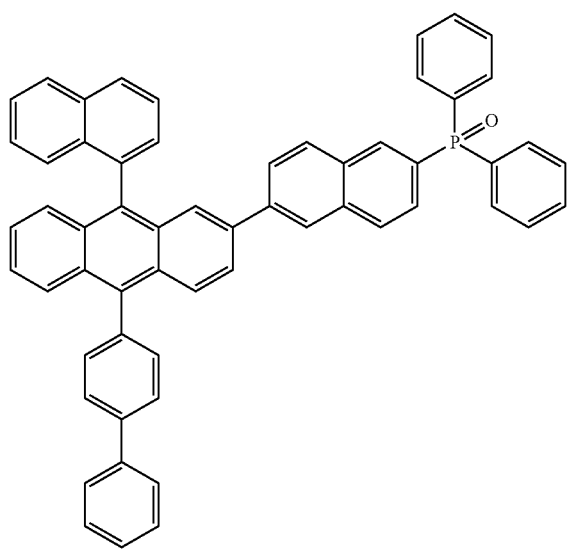

[Formula 9-17]
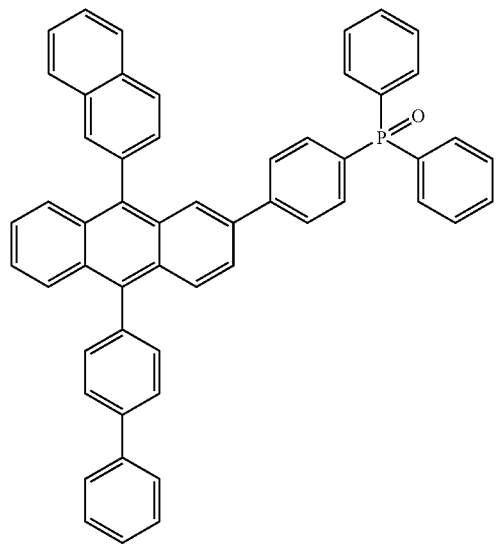
[Formula 9-18]
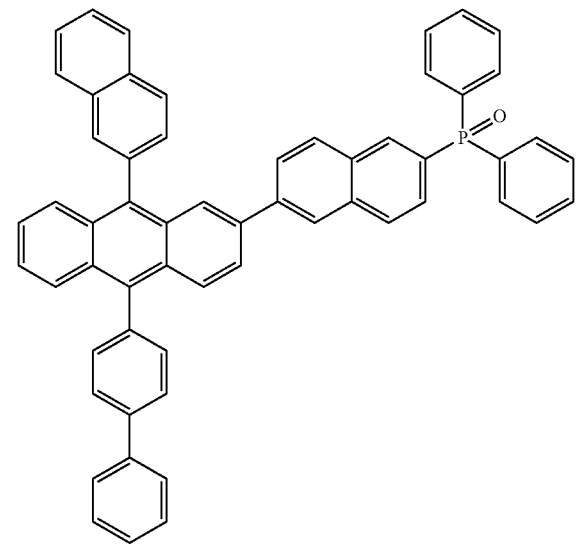
[Formula 9-19]
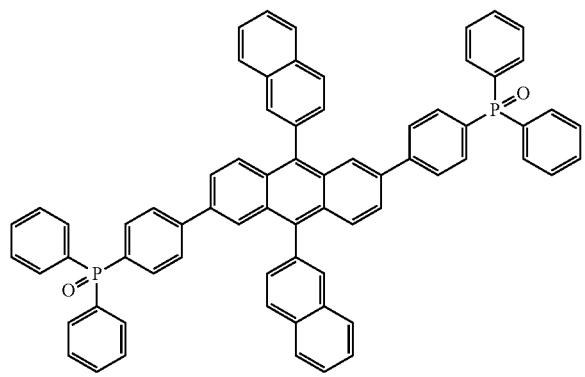
[Formula 9-20]
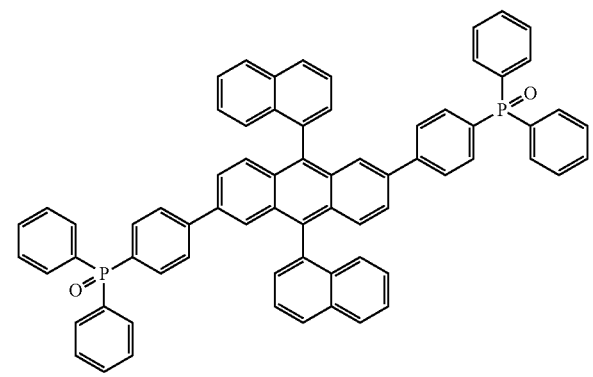
[Formula 9-21]
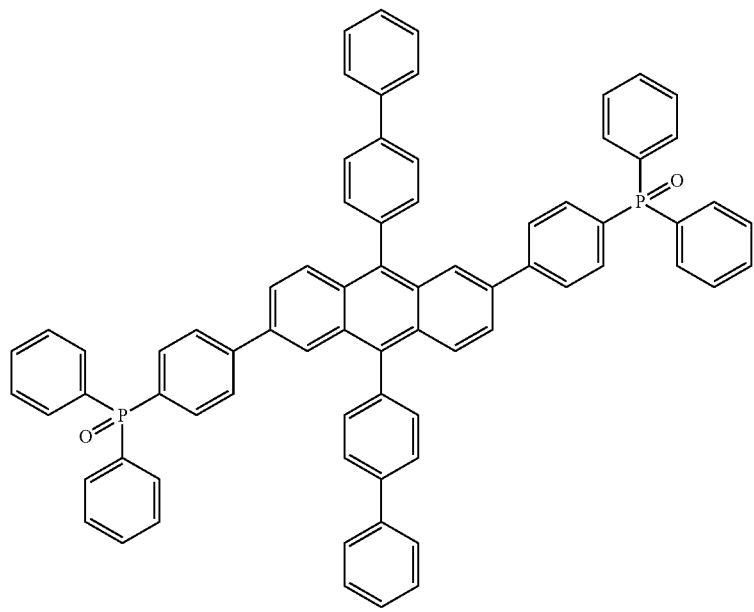

[Formula 9-22]
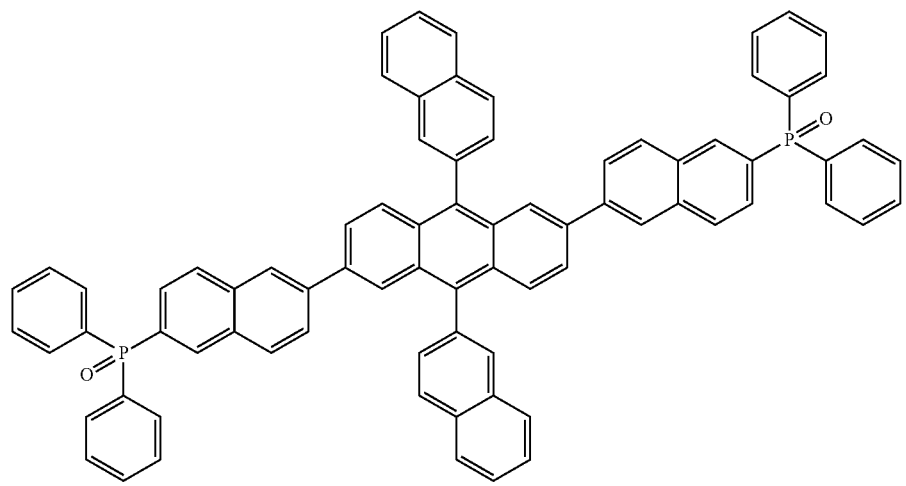
[Formula 9-23]
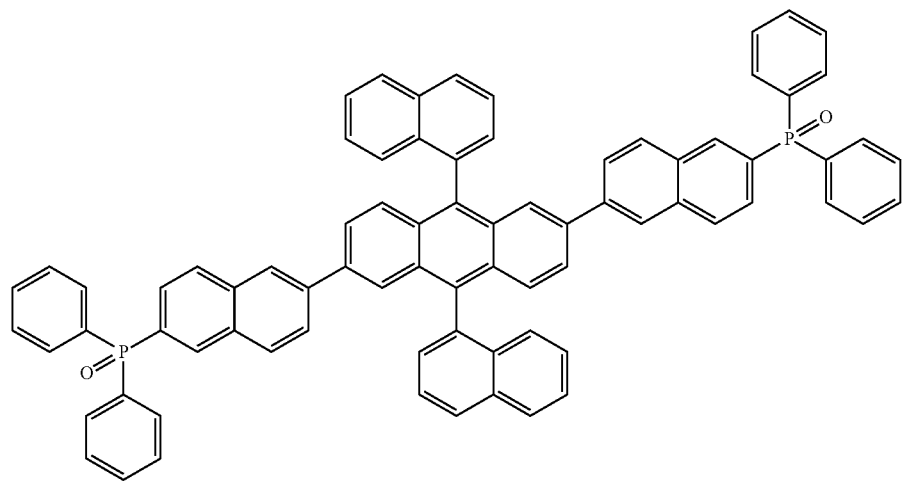
[Formula 9-24]
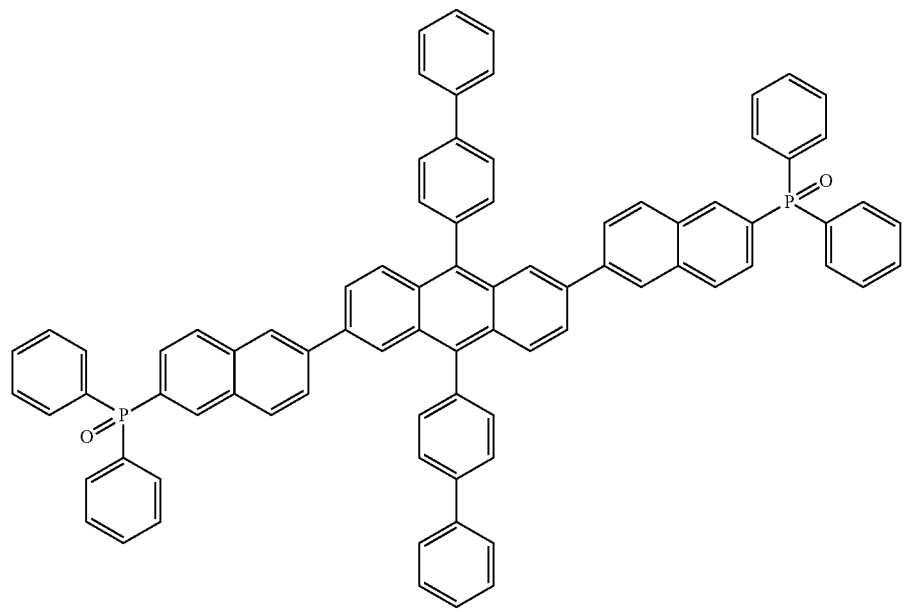

Hereinafter, a method of manufacturing the compound represented by Formulas 1 to 10 will be described.

The compounds represented by Formulas 1 to 10 may be manufactured by using a general method known in the art, such as a condensation reaction and a Suzuki coupling reaction.

The compounds represented by Formulas 1 to 10 may have properties suitable to be used as the organic material layer used in the organic light emitting device by introducing various substituents into a core structure represented by the aforementioned Formulas. The compounds represented by Formulas 1 to 10 may exhibit properties even though the compounds are used in any layer of the organic light emitting device, but particularly may have the following properties.

The compounds into which the substituted or unsubstituted arylamine group is introduced are suitable for materials of a light emitting layer and a hole injection and hole transport layer, and the compounds into which the heterocyclic group comprising N is introduced are suitable for materials of an electron injection and electron transport layer and a hole blocking layer.

The conjugation length of the compound has a close relationship with an energy band gap. Specifically, the energy band gap is reduced as the conjugation length of the compound increases. As described above, since the core of the compounds represented by Formulas 1 to 10 comprises a limited conjugation, the core has properties of from a small energy band gap to a large energy band gap.

In addition, compounds having intrinsic properties of the introduced substituent groups may be synthesized by introducing various substituent groups to the aforementioned core structure. For example, the material of the hole injection layer and the material of the hole transport layer used when the organic light emitting device is manufactured may be a compound having the energy level that can transporting holes according to HOMO and can prevent electrons from moving from the light emitting layer according to LUMO. In particular, the core structure of the present compound may exhibit a stable property to the electrons, thus contributing to improving a life-span of the device. The derivatives constituted by introducing substituents so as to be used in the materials of the light emitting layer and the electron transport layer may be manufactured so that various arylamine-based dopants, aryl-based dopants, and dopants comprising metal have an appropriate energy band gap.

Further, the energy band gap can be finely controlled, a property at an interface between organic materials can be improved, and the purpose of the material can become various by introducing various substituent groups to the core structure.

Meanwhile, since the compounds represented by Formulas 1 to 10 have a high glass transition temperature (Tg), thermal stability is excellent. Such increase in thermal stability is an important factor providing driving stability to the device.

In the present invention, specific examples of the alkali metal complex may comprise the compound represented by the following Formula 11, but are not limited thereto.

[Formula 11]

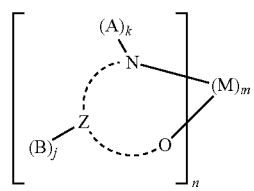

In Formula 11,

Z and a dashed arc mean two or three atoms and bonds essentially required to perfect a 5- or 6-membered cycle together with M;

A each represent H or a substituent, B each represent an independently selected substituent on a Z atom, with a proviso that two or more substituents may be bonded to each other to form a fused cycle or a fused cycle system;

j is 0 to 3, k is 1 or 2;

M represents alkali metal or alkali earth metal; and m and n are an integer independently selected so as to provide a neutral charge on a complex.

Formula 11 may be represented by the following Formula 11-a, but is not limited thereto.

[Formula 11-a]

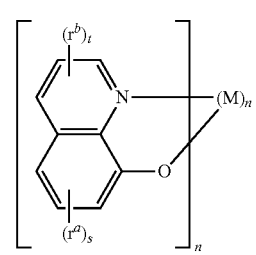

In Formula 11-a, M represents the aforementioned alkali metal or alkali earth metal. M may be $Li^+$, but is not limited thereto. $r^a$ and $r^b$ may be an each independently selected substituent, but two substituents may be bonded to each other to form a fused cycle group. Examples of the substituent comprise a methyl group, a phenyl group, a fluoro substituent, and a fused benzene cycle group formed by bonding two substituents. In Formula 11-a, t is 1 to 3, is 1 to 3, and n is an integer of 1 to 6.

Formula 11 may be represented by the following Formula 11-b, but is not limited thereto.

[Formula 11-b]

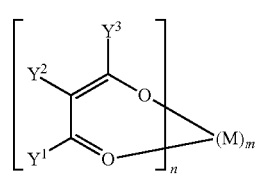

Formula 11-b, $Y^1$, $Y^2$, and $Y^3$ each independently represent the substituent, but predetermined $Y^1$, $Y^2$, and $Y^3$ may be bonded to each other to form a cycle or a fused cycle system. M is alkali metal or alkali earth metal, and m and n are integers selected so as to provide neutral charges on a complex. M may be $Li^+$, but is not limited thereto. In the case where the substituent is hydrogen and M represents $Li^+$, Formula 11-b represents lithium acetylacetonate. In addition to hydrogen, examples of other substituents comprise an alkyl group such as a carbocyclic group, a heterocyclic group, and a methyl group, an aryl group such as a phenyl group, or a naphthyl group. The fused cycle group may be formed by bonding two substituents.

Formula 11 may be represented by any one of the following Formulas 11-1 to 11-30, but is not limited thereto.

[Formula 11-1]
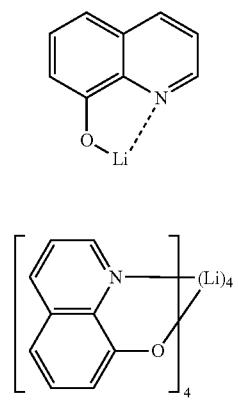
[Formula 11-2]
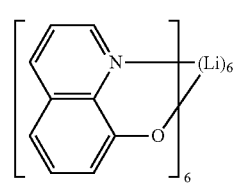
[Formula 11-3]
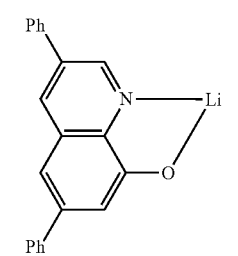
[Formula 11-4]
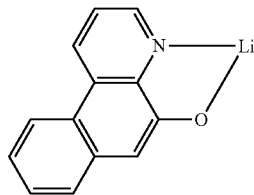
[Formula 11-5]
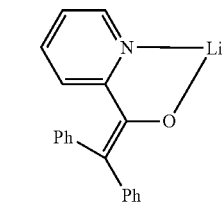
[Formula 11-6]
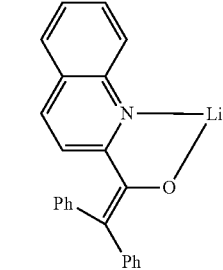
[Formula 11-7]
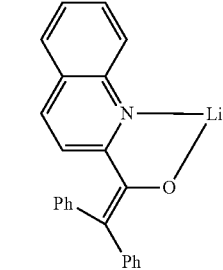
-continued
[Formula 11-8]
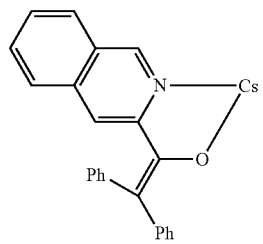
[Formula 11-9]
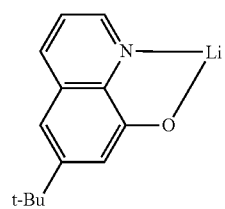
[Formula 11-10]
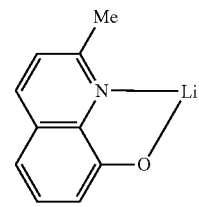
[Formula 11-11]
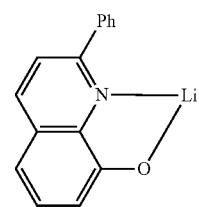
[Formula 11-12]
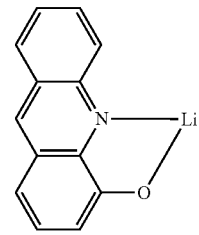
[Formula 11-13]
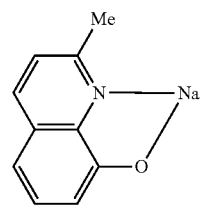
[Formula 11-14]
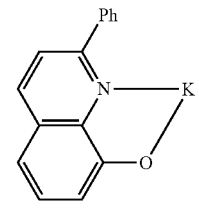

[Formula 11-15]

[Formula 11-16]

[Formula 11-17]

[Formula 11-18]

[Formula 11-19]

[Formula 11-20]

[Formula 11-21]

[Formula 11-22]

[Formula 11-23]

[Formula 11-24]

[Formula 11-25]

Li₂O

[Formula 11-26]

LiF

[Formula 11-27]

CsF

[Formula 11-28]

[Formula 11-29]

[Formula 11-30]

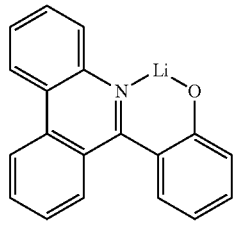

In the present invention, one or more layers of the organic material layer comprise a compound where the alkali metal complex like Formula 11 is docked to one or more of a hetero atom, the phosphine oxide group, the thioxophosphine group, and the selenoxophosphine group of one or more compounds of a heteroaryl-based compound; and a compound comprising the phosphine oxide group (—P=O), the thioxophosphine group (—P=S), or the selenoxophosphine group (—P=Se).

More specifically, the metal atom of the alkali metal complex may be docked to the hetero atom of the heteroaryl-based compound. Further, the metal atom of the alkali metal complex may be docked to O, S, or Se of one or more compounds of the compounds comprising the phosphine oxide group (—P=O), the thioxophosphine group (—P=S), or the selenoxophosphine group (—P=Se).

Further, the compound comprising the phosphine oxide group (—P=O), the thioxophosphine group (—P=S), or the selenoxophosphine group (—P=Se) may be a heteroaryl-based compound further comprising a hetero atom such as a nitrogen (N) atom. In this case, the metal atom of the alkali metal complex may be further docked to O, S, or Se and N.

That is, in the present invention, when the organic material layer of the organic light emitting device is formed, in the case where one or more compounds of the heteroaryl-based compound; and the compound comprising the phosphine oxide group (—P=O), the thioxophosphine group (—P=S), or the selenoxophosphine group (—P=Se) are codeposited together with the alkali metal complex, the hetero atom, the phosphine oxide group (—P=O), the thioxophosphine group (—P=S), or the selenoxophosphine group (—P=Se) of one or more compounds of the heteroaryl-based compound; and the compound comprising the phosphine oxide group (—P=O), the thioxophosphine group (—P=S), or the selenoxophosphine group (—P=Se) plays a role of a docking site with the alkali metal complex, such that the dipole moment of the compound comprised in the organic material layer is increased, thus increasing a life-span property of the organic light emitting device.

In the present invention, the term "docking" means a state where one or more of the hetero atom, the phosphine oxide group, the thioxophosphine group, and the selenoxophosphine group of one or more compounds of the heteroaryl-based compound; and the compound comprising the phosphine oxide group (—P=O), the thioxophosphine group (—P=S), or the selenoxophosphine group (—P=Se), and the alkali metal complex are bonded to each other by a London dispersion force or a dipole-induced dipole force.

In the present invention, the dipole moment of the docked compound may be calculated by the following Equation.

Dipole Moment $$p(r) = \int_V \rho(r_0)(r_0 - r)d^3r_0$$

$\rho(r_0)$: molecular density
V: volume
r: the point of observation
$d^3r_0$: an elementary volume In the above, a molecular density is obtained by calculation to obtain the aforementioned dipole value, the charge and the dipole for each atom are obtained from the molecular density by using a method of Hirshfeld charge analysis, and the dipole moment may be calculated by putting the calculated result into the aforementioned Equation according to the following Equation.

Deformation Density $$\rho_d(r) = \rho(r) - \sum_\alpha \rho_\alpha(r - R_\alpha)$$

$\rho(r)$: molecular density
$\rho_\alpha(r - R_\alpha)$: density of the free atom $\alpha$ located at coordinates $R_\alpha$ Atomic Charge $$q(\alpha) = \int \rho_d(r) W_\alpha(r) d^3 r$$

Weight Function $$W_\alpha(r) = \rho_\alpha(r - R_\alpha) \left[ \sum_\beta \rho_\beta(r - R_\beta) \right]^{-1}$$

W(r): weight function

In the present invention, the compound where the alkali metal complex is docked to one or more compounds of the heteroaryl-based compound; and the compound comprising the phosphine oxide group (—P=O), the thioxophosphine group (—P=S), or the selenoxophosphine group (—P=Se) may be used to change the dipole moment of the compound as compared to the compound where the alkali metal complex is not docked. Therefore, a life-span of the organic light emitting device may be more effectively increased.

In the present invention, the organic material layer may have a multilayered structure comprising a hole injection layer, a hole transport layer, a light emitting layer, an electron transport layer and the like, but is not limited thereto and may have a single layer structure. Further, the organic material layer may be manufactured to have the smaller number of layers by using various polymer materials and by not a deposition method but a solvent process, for example, a method such as spin coating, dip coating, doctor blading, screen printing, inkjet printing, or a heat transferring method.

Particularly, in the present invention, it is more preferable that the compound where the dipole moment is changed be comprised in the electron transport layer.

Further, the method of manufacturing the organic light emitting device according to the present invention comprises sequentially forming a first electrode, an organic material layer, and a second electrode on a substrate, and forming at least one layer of organic material layers by codepositing one or more compounds of compounds comprising the heteroaryl-based compound, and the phosphine oxide-based compound, or the compound comprising the heteroaryl group and the phosphine oxide group together with an alkali metal complex.

A weight ratio of the alkali metal complex to the heteroaryl-based compound, the phosphine oxide-based compound, or the compound comprising the heteroaryl group and the phosphine oxide group may be 0.1 to 0.7, or 0.1 to 0.5, but is not limited thereto.

The organic light emitting device according to the present invention may be manufactured by using a manufacturing method and a material of a general organic light emitting device, except that one or more organic material layers are formed by using the aforementioned compounds.

The organic material layer of the organic electronic device of the present invention may be constituted by a single layer structure, but by a multilayered structure in which two or more organic material layers are laminated. For example, the organic electronic device of the present invention may have a structure comprising a hole injection layer, a hole transport layer, a light emitting layer, an electron transport layer, an electron injection layer and the like as an organic material layer. However, the structure of the organic electronic device is not limited thereto, but may comprise the smaller number of organic material layers.

Accordingly, in the organic electronic device of the present invention, the organic material layer may comprise one or more layers of the hole injection layer, the hole transport layer, and a layer injecting and transporting holes simultaneously, and one or more layers of the layers may comprise the compound according to the present invention.

Further, the organic material layer may comprise the light emitting layer, and the light emitting layer may comprise the compound according to the present invention.

Further, the organic material layer may comprise one or more layers of an electron transport layer, an electron injection layer, and a layer transporting and injecting electrons simultaneously, and one or more layers of the layers may comprise the compound according to the present invention.

In the organic material layer having the multilayered structure, the compound according to the present invention may be comprised in a light emitting layer, a layer injecting/transporting holes and emitting light simultaneously, a layer transporting holes and emitting light simultaneously, a layer transporting electrons and emitting light simultaneously or the like.

For example, the structure of the organic light emitting device of the present invention may have a structure shown in FIGS. 1 to 4, but is not limited thereto.

FIG. 1 shows a structure of an organic light emitting device, in which an anode 102, a light emitting layer 105, and a cathode 107 are sequentially laminated on a substrate 101. In the aforementioned structure, the compound according to the present invention may be comprised in the light emitting layer 105.

FIG. 2 shows an example of a structure of an organic light emitting device, in which an anode 102, hole injection/hole transport and light emitting layers 105, an electron transport layer 106, and a cathode 107 are sequentially laminated on a substrate 101. In the aforementioned structure, the compound according to the present invention may be comprised in the hole injection/hole transport and light emitting layers 105.

FIG. 3 shows an example of a structure of an organic light emitting device, in which a substrate 101, an anode 102, a hole injection layer 103, hole transport and light emitting layers 105, an electron transport layer 106, and a cathode 107 are sequentially laminated. In the aforementioned structure, the compound according to the present invention may be comprised in the hole injection/hole transport and light emitting layers 105.

FIG. 4 shows an example of a structure of an organic light emitting device, in which a substrate 101, an anode 102, a hole injection layer 103, a hole transport layer 104, electron transport and light emitting layers 105, and a cathode 107 are sequentially laminated. In the aforementioned structure, the compound according to the present invention may be comprised in the electron transport and light emitting layers 105.

For example, the organic light emitting device according to the present invention may be manufactured by forming the anode by depositing metal or metal oxides having the conductivity or an alloy thereof on the substrate by using a PVD (physical vapor deposition) method such as sputtering or e-beam evaporation, forming the organic material layer comprising the hole injection layer, the hole transport layer, the light emitting layer, and the electron transport layer thereon, and depositing the material that is capable of being used as the cathode thereon. In addition to this method, the organic light emitting device may be manufactured by sequentially depositing a cathode material, an organic material layer, and an anode material on the substrate.

The organic material layer may have a multilayered structure comprising the hole injection layer, the hole transport layer, the light emitting layer, the electron transport layer and the like, but is not limited thereto and may have a single layer structure. Further, the organic material layer may be manufactured to have the smaller number of layers by using various polymer materials and by not the deposition method but the solvent process, for example, a method such as spin coating, dip coating, doctor blading, screen printing, inkjet printing, or the heat transferring method.

It is preferable that the anode material be, in general, a material having a large work function so as to smoothly perform hole injection into the organic material layer. Specific examples of the anode material that is capable of being used in the present invention comprise metal such as vanadium, chrome, copper, zinc and gold, or an alloy thereof; metal oxides such as zinc oxides, indium oxides, indium tin oxides (ITO) and indium zinc oxides (IZO); a combination of metal and oxides such as $ZnO:Al$ or $SnO_2:Sb$; conductive polymers such as poly(3-methyl compound), poly[3,4-(ethylene-1,2-dioxy) compound](PEDT), polypyrole, and polyaniline and the like, but are not limited thereto.

It is preferable that the cathode material be, in general, a material having a small work function so as to smoothly perform electron injection into the organic material layer. Specific examples of the cathode material comprise metal such as magnesium, calcium, sodium, potassium, titanium, indium, yttrium, lithium, gadolinium, aluminum, silver, tin, and lead, or an alloy thereof; a multilayered structure material such as LiF/Al or $LiO_2/Al$, and the like but are not limited thereto.

The hole injection material is a material that is capable of well receiving holes from the anode at a low voltage, and it is preferable that the HOMO (highest occupied molecular orbital) of the hole injection material be a value between the work function of the anode material and the HOMO of the organic material layer therearound. Specific examples of the hole injection material comprise metal porphyrine, oligothiophene, an arylamine-based organic material, a hexanitrilehexaazatriphenylene-based organic material, a quinacridone-based organic material, a perylene-based organic material, anthraquinone, polyaniline, a polycompound-based conductive polymer and the like, but are not limited thereto.

The hole transport material is a material that is capable of receiving the holes from the anode or the hole injection layer and transporting the holes to the light emitting layer, and is preferably a material having large mobility to the holes. Specific examples thereof comprise an arylamine-based organic material, a conductive polymer, a block copolymer in which a conjugate portion and a non-conjugate portion are present together, and the like, but are not limited thereto.

The light emitting material is a material that is capable of receiving the holes and the electrons from the hole transport layer and the electron transport layer and bonds the holes and the electrons to emit light in a visible ray region, and is preferably a material having excellent photon efficiency to fluorescence or phosphorescence. Specific examples thereof comprise a 8-hydroxy-quinoline aluminum complex (Alq$_3$); a carbazole-based compound; a dimerized styryl compound; BAlq; a 10-hydroxybenzoquinoline-metal compound; a benzoxazole, benzthiazole and benzimidazole-based compound; a poly(p-phenylenevinylene) (PPV)-based polymer; a spiro compound; polyfluorene, lubrene, and the like, but are not limited thereto.

The electron transport material is a material that is capable of receiving the electrons well from the cathode and transporting the electrons to the light emitting layer, and is preferably a material having large mobility to the electrons. Specific examples thereof comprise a 8-hydroxyquinoline Al complex; a complex comprising Alq$_3$; an organic radical compound; a hydroxyflavone metal complex, and the like, but are not limited thereto.

The organic light emitting device according to the present invention may be a top emission type, a bottom emission type, or a both-sided emission type according to the used material.

The compound according to the present invention may be applied to an organic electronic device such as an organic solar cell, an organic photoconductor, and an organic transistor by the principle that is similar to the principle applied to the organic light emitting device.

MODE FOR INVENTION

Hereinafter, preferable Examples will be described in order to help understanding of the present invention. However, the following Examples are set forth to illustrate the present invention, but the scope of the present invention is not limited thereto.

EXAMPLE

Example 1

The compound represented by the following Formula 12 was used to measure a change in dipole moment according to bonding of the additional substituent group to the compound represented by the following Formula 12, and the result is described in the following Table 1.

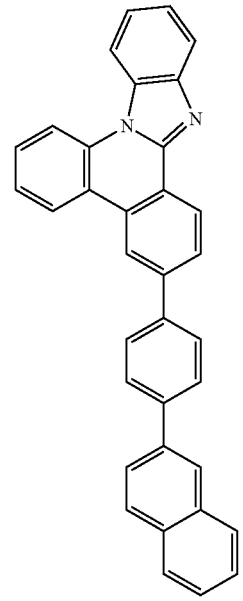

[Formula 12]

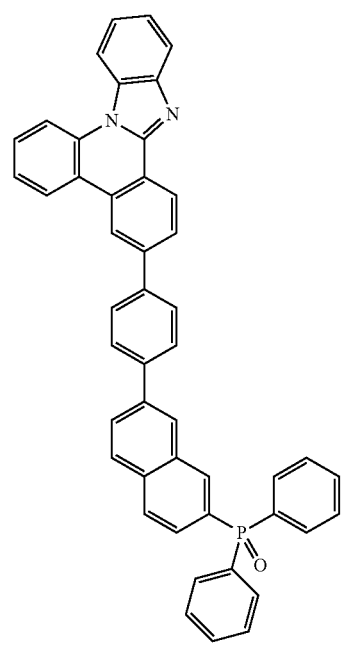

[Formula 13]

[Formula 14]

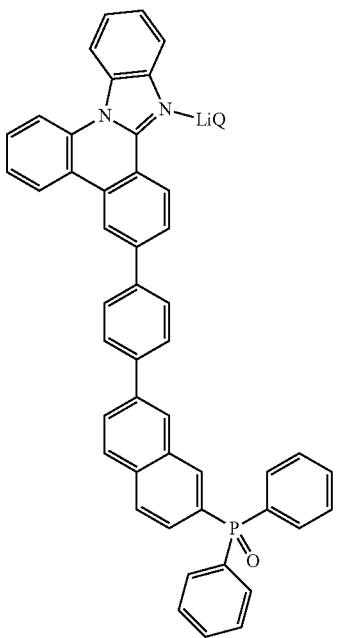

[Formula 15]

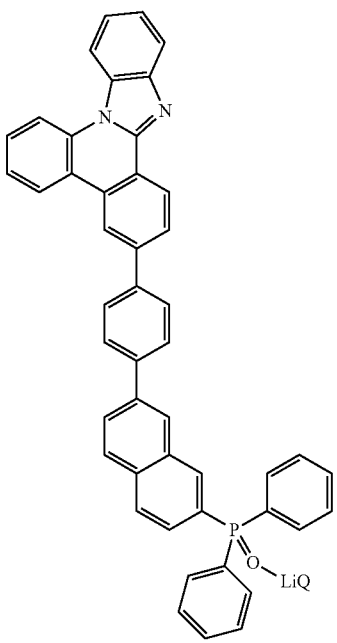

[Formula 16]

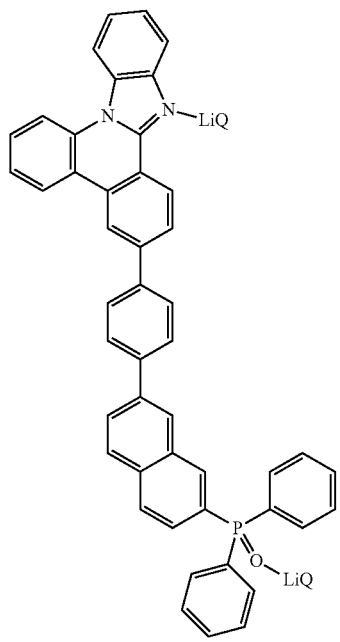

The compound represented by Formula 13 is a compound where the phosphine oxide group is further bonded to the compound represented by Formula 12, and the compound represented by Formula 14 is a compound where the alkali metal complex is docked to the nitrogen atom of the compound represented by Formula 13. Further, the compound represented by Formula 15 is a compound where the alkali metal complex is docked to the phosphine oxide group of the compound represented by Formula 13, and the compound represented by Formula 16 is a compound where the alkali metal complex is docked to both the nitrogen atom and the phosphine oxide group of the compound represented by Formula 13.

In Formulas 14 to 16, LiQ is a compound represented by the following Formula 11-1.

[Formula 11-1]

TABLE 1

| Compound | Dipole moment |
|---|---|
| Formula 12 | 3.07 |
| Formula 13 | 6.51 |
| Formula 14 | 10.80 |
| Formula 15 | 12.49 |
| Formula 16 | 15.85 |

As described above, it can be seen that as compared to the compound where the alkali metal complex is not docked, the dipole moment of the compound where the alkali metal complex is docked to the hetero atom and/or the phosphine oxide group of the compound is increased.

In the case where the dipole moment of the compound comprised in the electron transport layer of the organic light emitting device is large, arrangement of molecules becomes irregular to densify the layer, accordingly, the organic light emitting device can endure stress well to improve a life-span property.

In the present invention, since there is a limit in increase of the dipole moment only by the molecule, as described above, the dipole moment may be more increased by using the layer where the heteroaryl-based compound, the phosphine oxide-based compound, or the compound comprising the heteroaryl group and the phosphine oxide group and the alkali metal complex are mixed as the electron transport layer, thus improving a life-span property of the organic light emitting device.

Experimental Example 1

The life-span properties of the organic light emitting device where only the compound represented by Formula 12 is applied to the electron transport layer and the organic light emitting device where the compound represented by Formula 12 and the alkali metal complex (LiQ) are applied together to the electron transport layer were evaluated, and the result is described in the following FIG. 5. Herein, other constitution components of the organic light emitting device were the same, except that the compound constituting the electron transport layer was changed.

As shown in the following FIG. 5, it can be seen that the life-span property of the organic light emitting device of the present invention, in which the dipole moment of the compound comprised in the organic material layer is increased, is improved by two times as compared to the organic light emitting device in which the dipole moment thereof is not increased.

Experimental Example 2

The life-span properties of the organic light emitting device where only the compound represented by Formula 13 is applied to the electron transport layer and the organic light emitting device where the compound represented by Formula 13 and the alkali metal complex (LiQ) are applied together to the electron transport layer were evaluated, and the result is described in the following FIG. 6.

As shown in the following FIG. 6, it can be seen that the life-span property of the organic light emitting device of the present invention, in which the dipole moment of the compound comprised in the organic material layer is increased, is improved by four times as compared to the organic light emitting device in which the dipole moment thereof is not increased.

As described above, an organic light emitting device according to the present invention comprises a first electrode, a second electrode, and one or more organic material layers disposed between the first electrode and the second electrode, and a life-span property of the organic light emitting device can be largely improved by changing a dipole moment of a compound comprised in the organic material layers.

The invention claimed is:
1. An organic light emitting device comprising
a first electrode,
a second electrode, and
two or more organic material layers disposed between the first electrode and the second electrode,
wherein two or more layers of the organic material layers comprise an electron transport layer and a light emitting layer,
wherein the electron transport layer comprises a compound where a Li complex is docked to one or more of O of a phosphine oxide group of a compound comprising the phosphine oxide group (—P═O),
wherein the term "docked" means a state where one or more of the the phosphine oxide group of one or more compounds of the compound comprising the phosphine oxide group (—P═O), and the Li complex are bonded to each other by a London dispersion force or a dipole-induced dipole force,
wherein a weight ratio of the Li complex to the compound comprising the phosphine oxide group is 0.1 to 0.7,
wherein the Li complex is a compound represented by the following Formula 11:

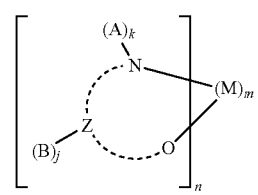

[Formula 11]

in Formula 11,
Z and a dashed arc mean two or three atoms and bonds essentially required to perfect a 5- or 6-membered cycle together with M;
A each represent H or a substituent, B each represent an independently selected substituent on a Z atom, with a proviso that two or more substituents may be bonded to each other to form a fused cycle or a fused cycle system;
j is 0 to 3, k is 1 or 2;
M represents Li; and
m and n are an integer independently selected so as to provide a neutral charge on the complex, and
wherein the compound comprising the phosphine oxide group (—P═O) is represented by any one of the following Formulas:

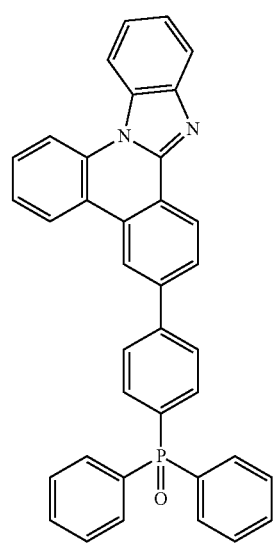

[Formula 1-1]

[Formula 1-2]
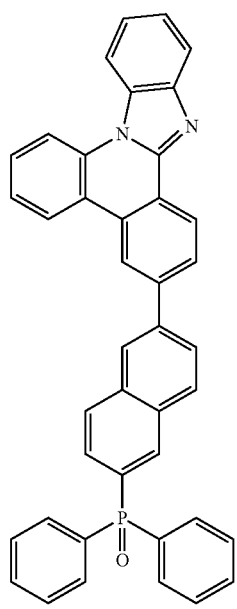
[Formula 1-3]
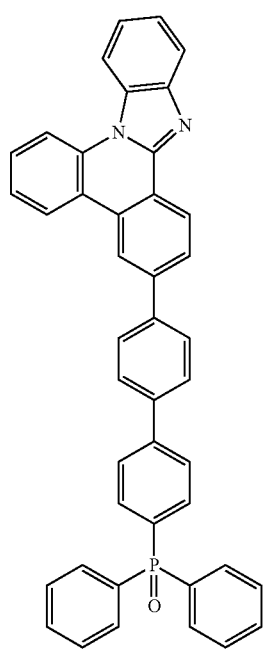
[Formula 1-4]
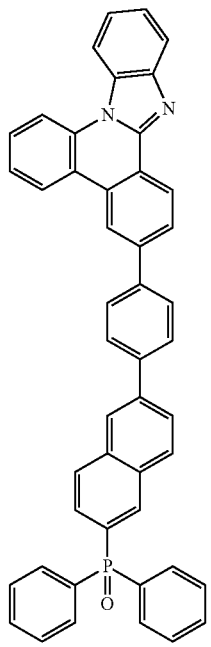
[Formula 1-5]
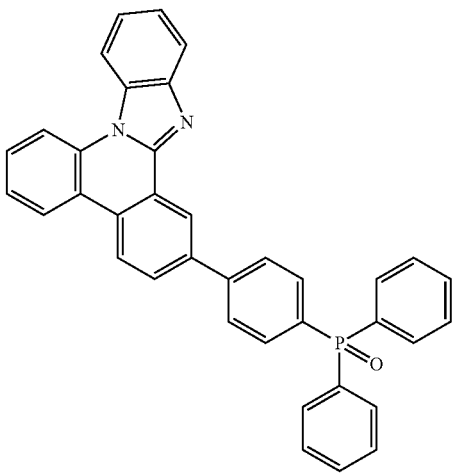

[Formula 1-6]
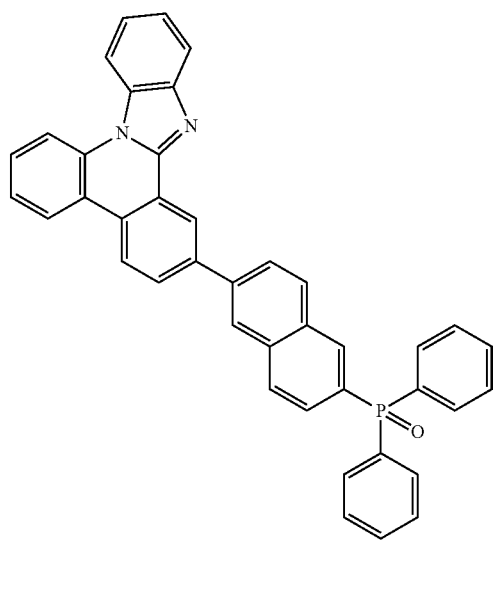
[Formula 1-7]
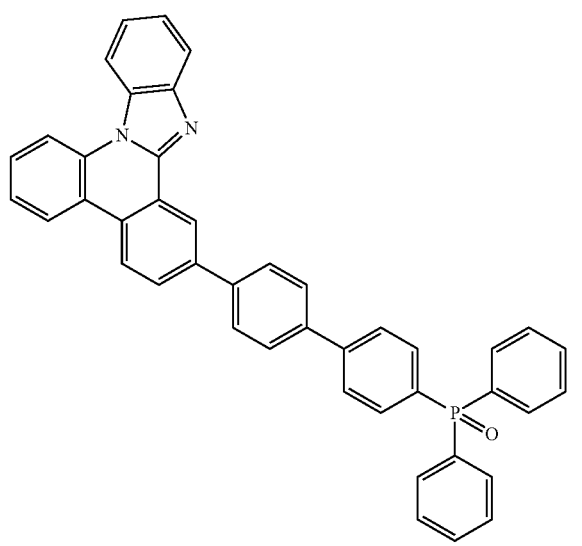
[Formula 1-8]
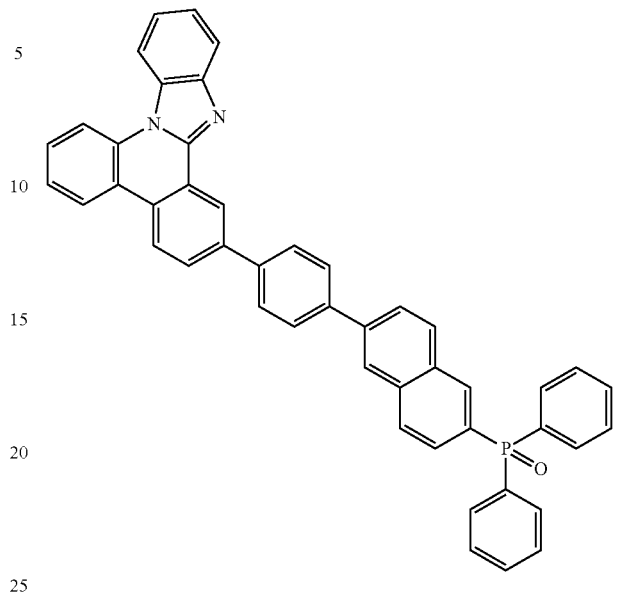
[Formula 1-9]
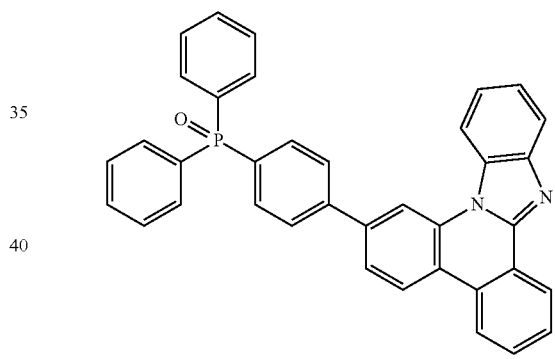
[Formula 1-10]
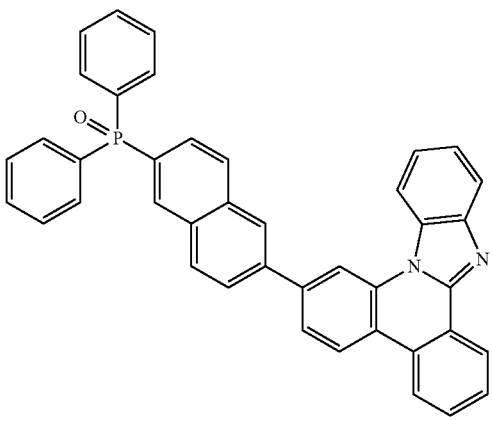

[Formula 1-11]
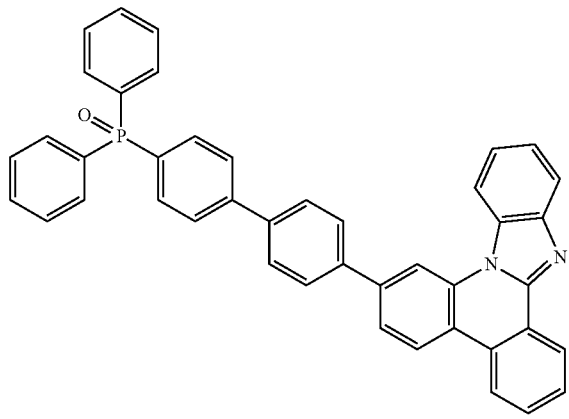
[Formula 1-14]
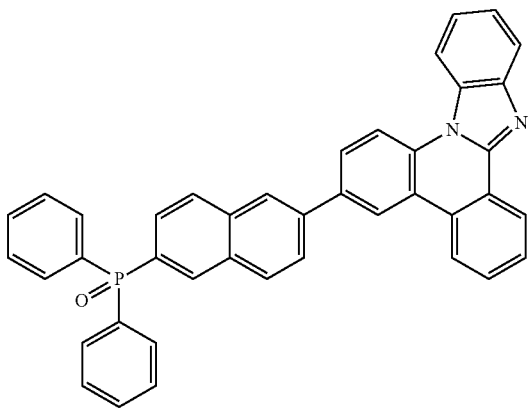
[Formula 1-12]
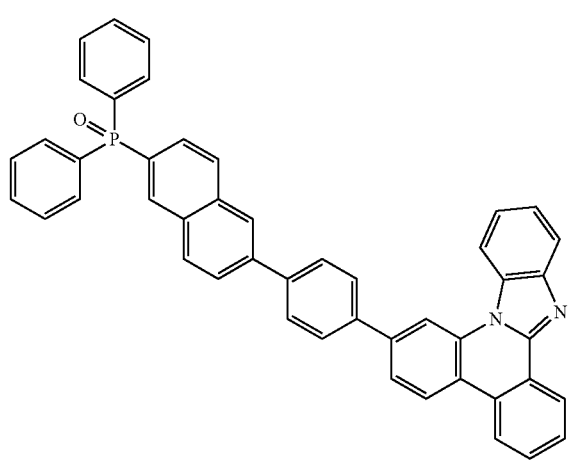
[Formula 1-15]
[Formula 1-13]
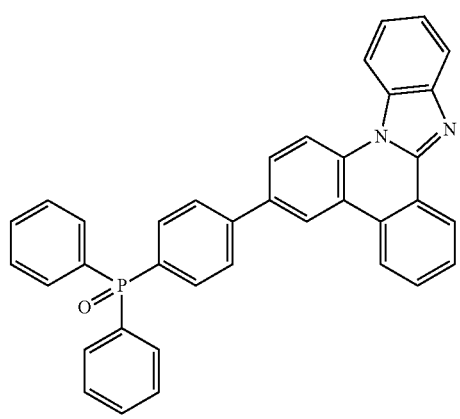
[Formula 1-16]
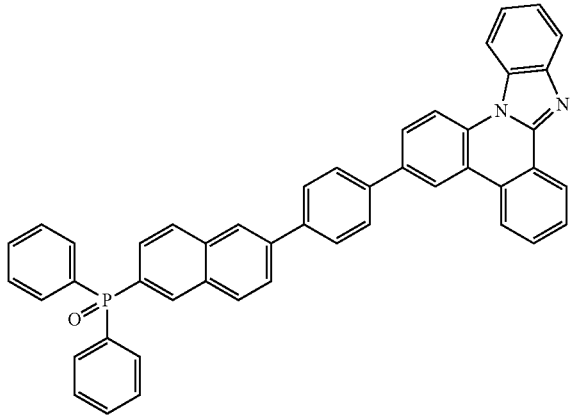

[Formula 1-17]
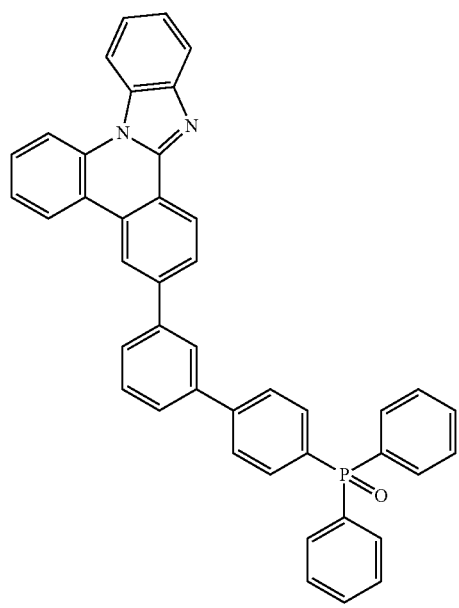
[Formula 1-20]
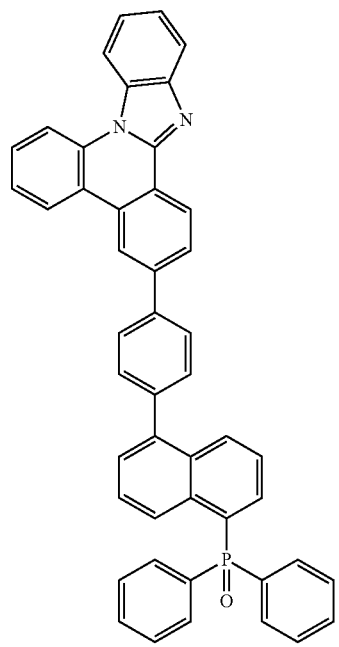
[Formula 1-18]
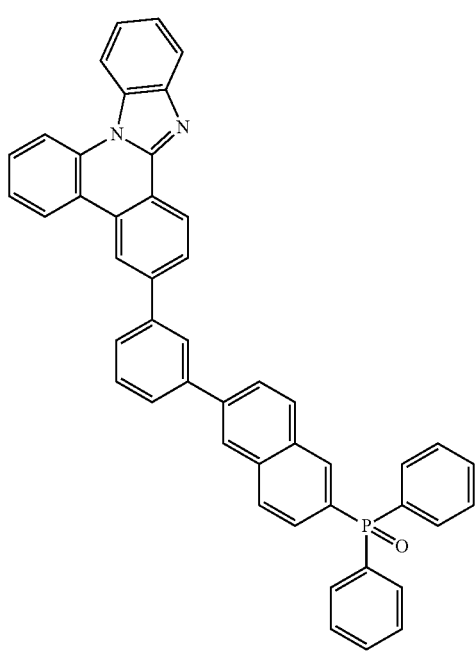
[Formula 1-24]
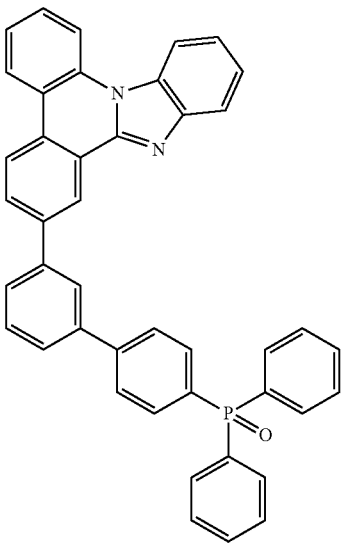

[Formula 1-25]
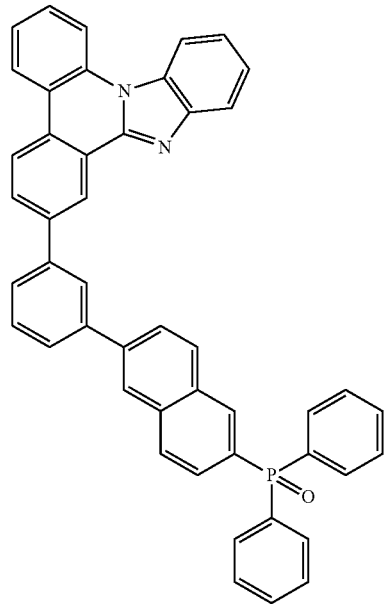
[Formula 1-31]
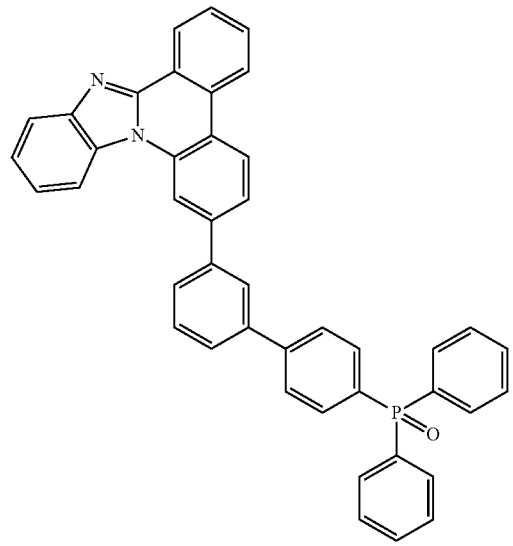
[Formula 1-27]
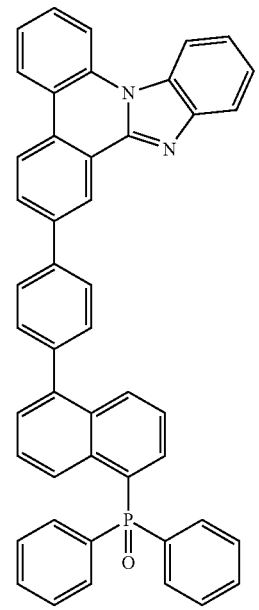
[Formula 1-32]
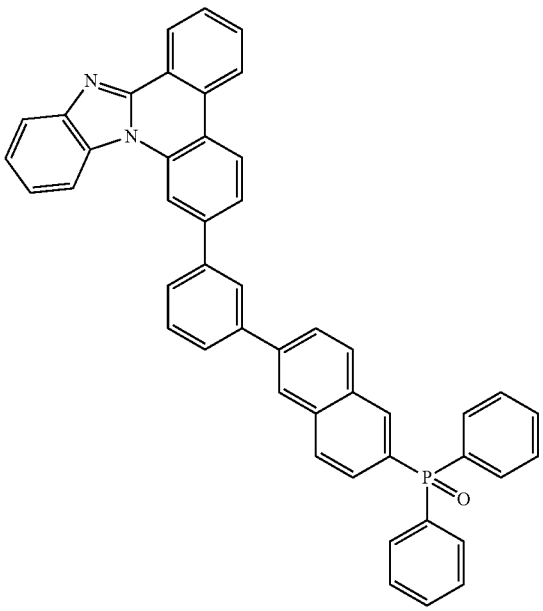

[Formula 1-34]
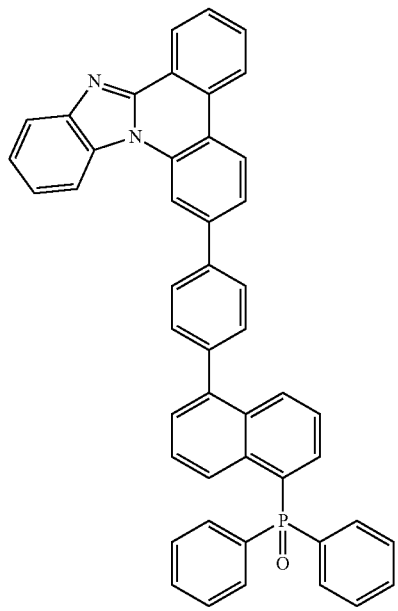
[Formula 1-38]
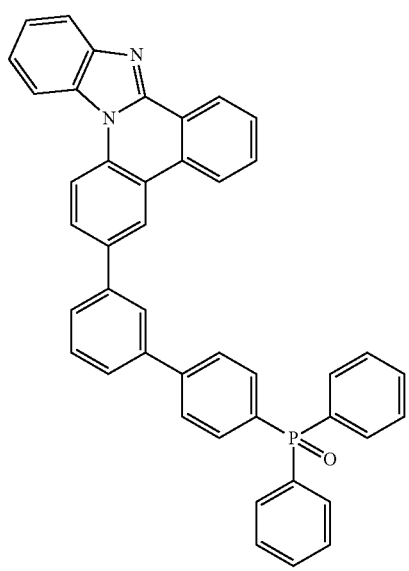
[Formula 1-39]
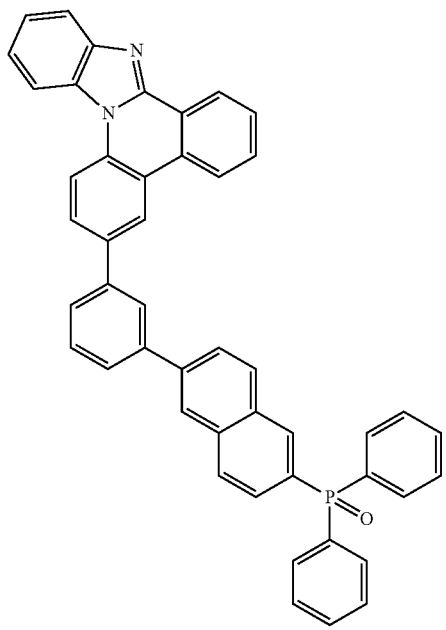
[Formula 1-41]
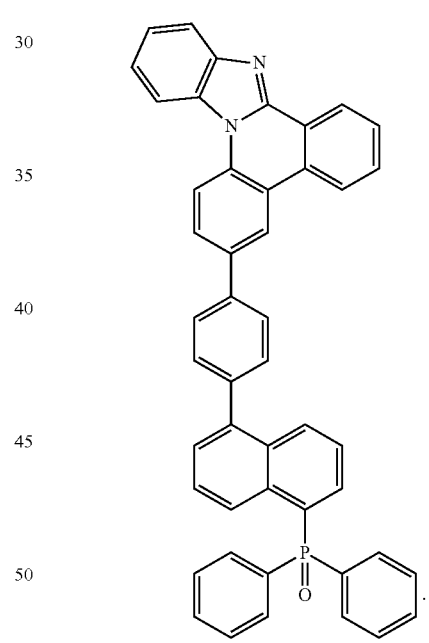
2. The organic light emitting device of claim 1, wherein the compound represented by the Formula 11 is represented by any one of the following Formulas:
[Formula 11-1]
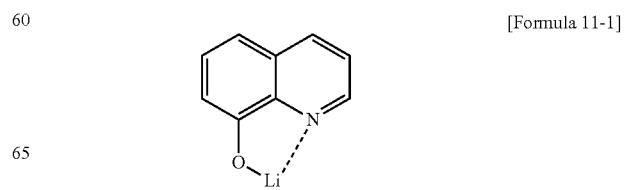

[Formula 11-2]
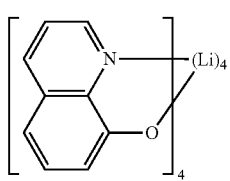
[Formula 11-3]
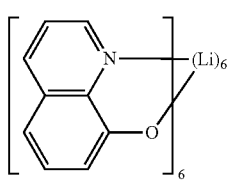
[Formula 11-4]
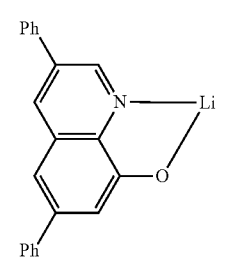
[Formula 11-5]
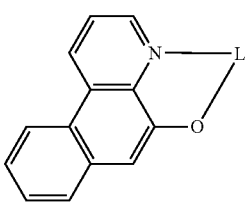
[Formula 11-6]
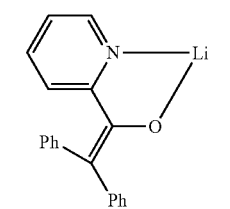
[Formula 11-7]
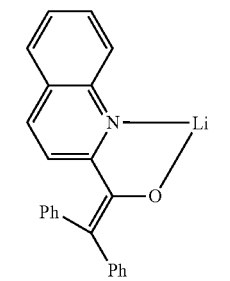
[Formula 11-9]
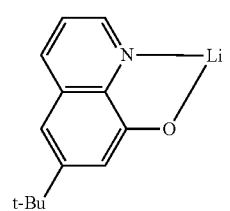
[Formula 11-10]
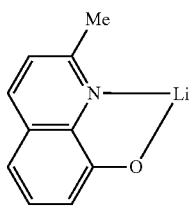
[Formula 11-11]
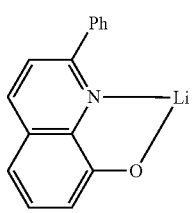
[Formula 11-12]
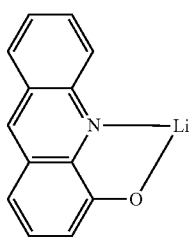
[Formula 11-20]
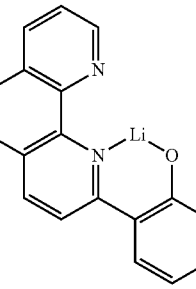
[Formula 11-28]
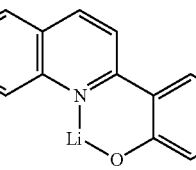
[Formula 11-29]
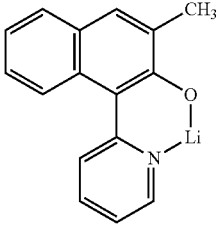

[Formula 11-30]

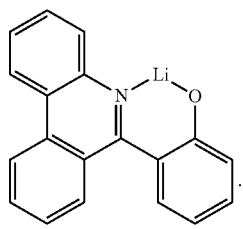

3. A method of manufacturing an organic light emitting device, comprising sequentially forming a first electrode, two or more organic material layers, and a second electrode on a substrate, wherein the two or more organic material layers comprise an electron transport layer and a light emitting layer, wherein the electron transport layer is formed by code-positing one or more of a compound comprising a phosphine oxide group(—P═O), with Li complex, wherein the Li complex is docked to one or more of O of a phosphine oxide group of the compound comprising the phosphine oxide group (—P═O), and wherein the term "docked" means a state where one or more of the phosphine oxide group, of one or more of the compound comprising the phosphine oxide group (—P═O), and the Li complex are bonded to each other by a London dispersion force or a dipole-induced dipole force, wherein a weight ratio of the Li complex to the compound comprising the phosphine oxide group is 0.1 to 0.7, and wherein the compound comprising the phosphine oxide group (—P═O) is represented by any one of the following Formulas:

[Formula 1-1]

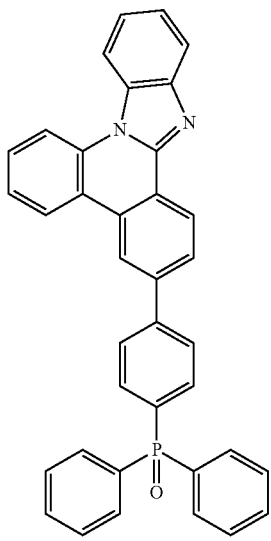

[Formula 1-2]

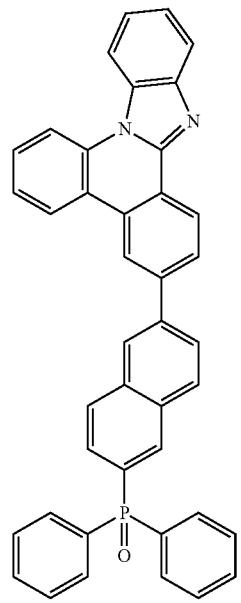

[Formula 1-3]

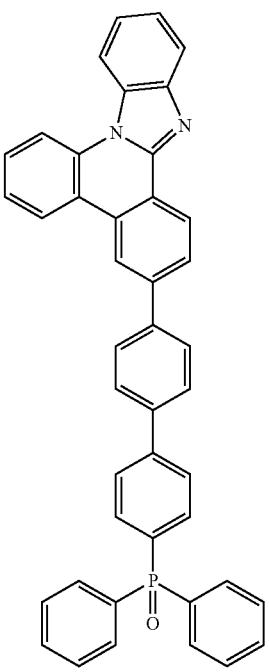

[Formula 1-4]
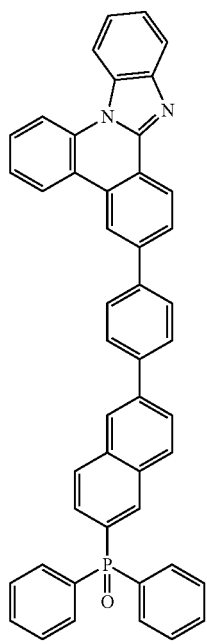
[Formula 1-6]
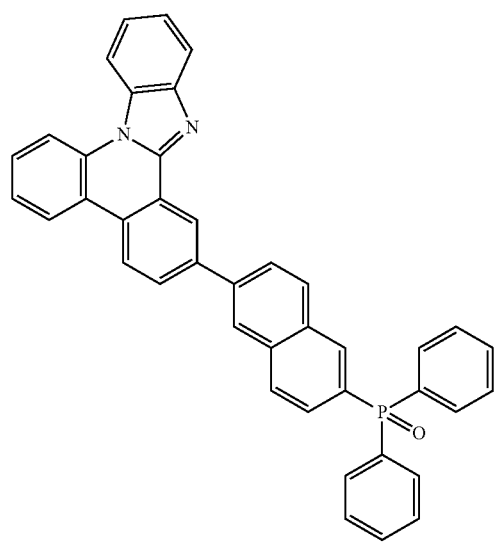
[Formula 1-5]
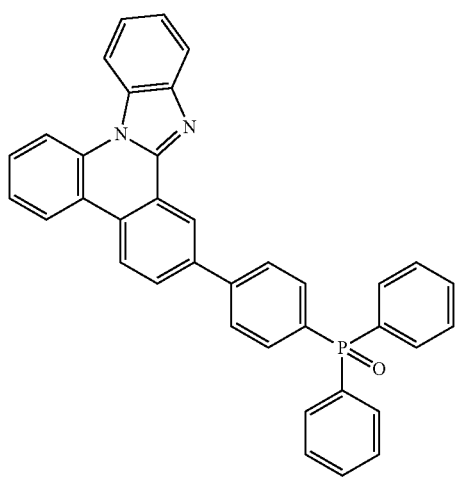
[Formula 1-7]

[Formula 1-8]
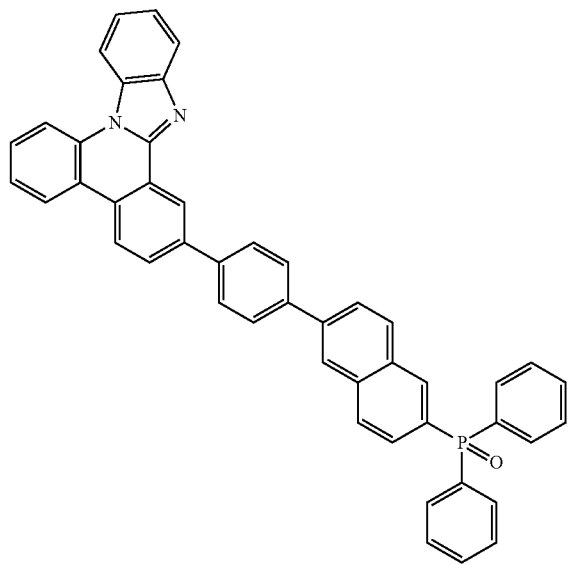
[Formula 1-9]
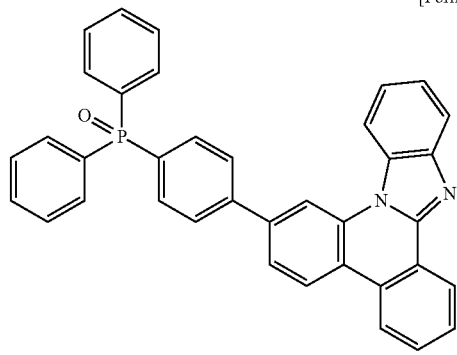
[Formula 1-10]
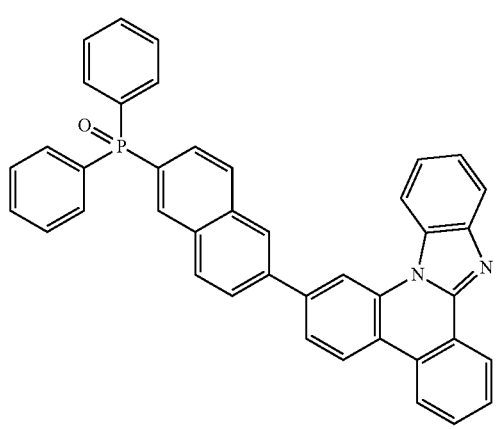
[Formula 1-11]
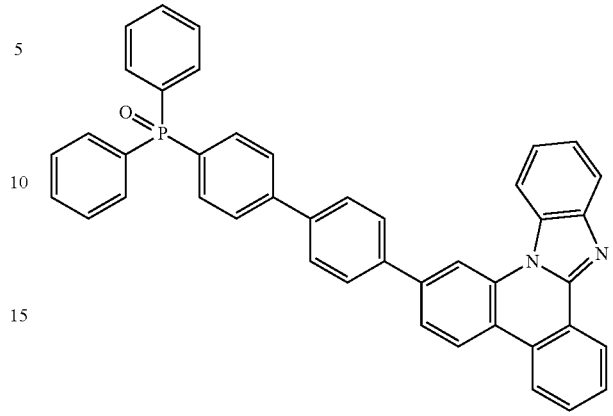
[Formula 1-12]
[Formula 1-13]
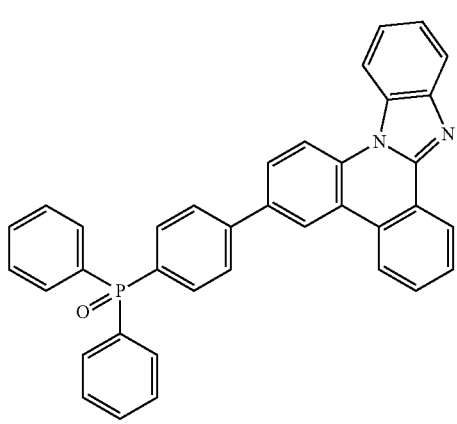

[Formula 1-14]
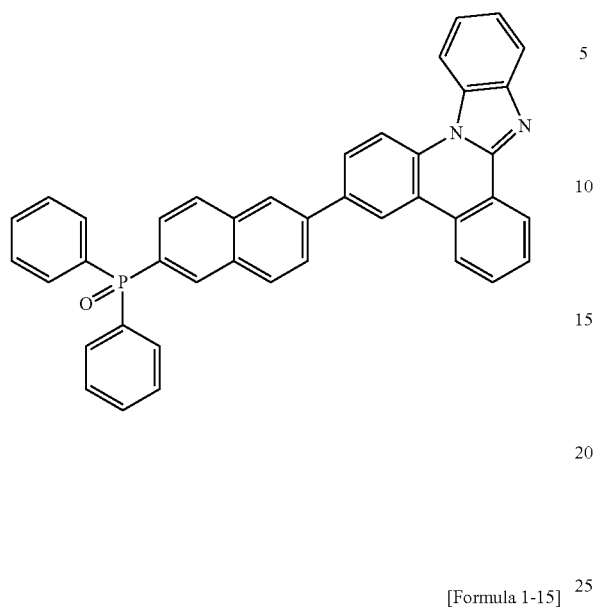
[Formula 1-15]
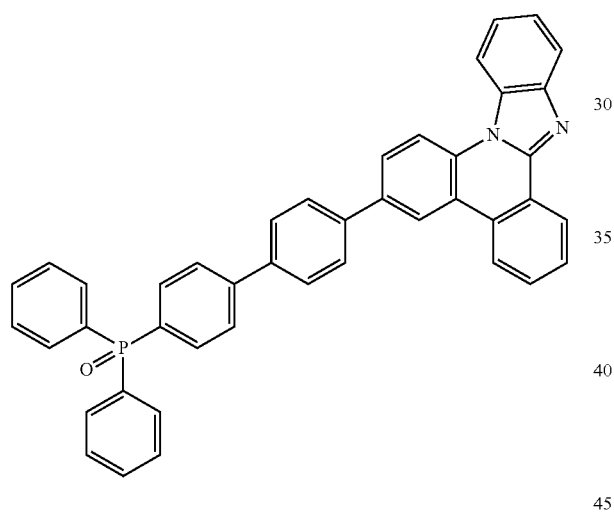
[Formula 1-16]
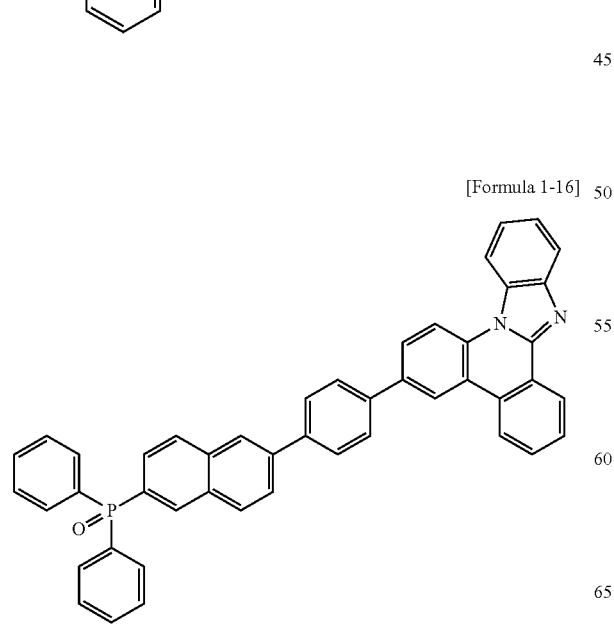
[Formula 1-17]
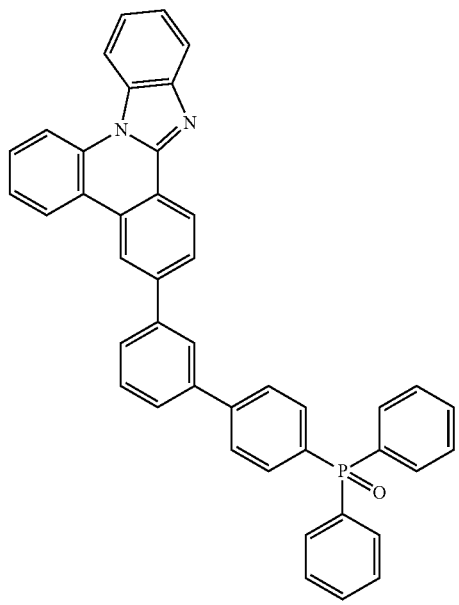
[Formula 1-18]
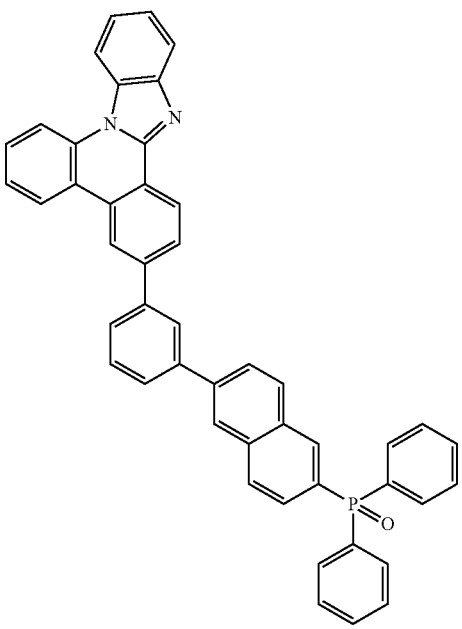

[Formula 1-20]
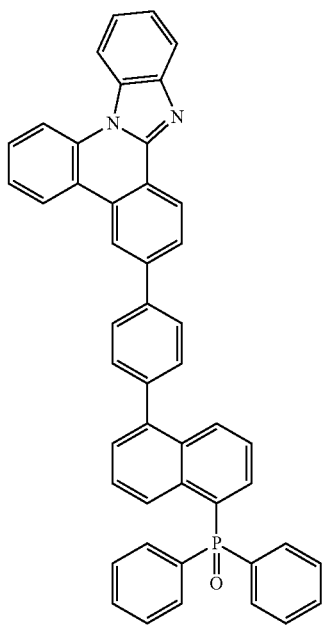
[Formula 1-25]
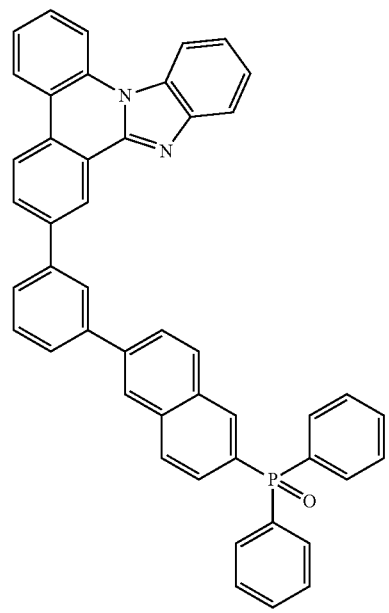
[Formula 1-24]
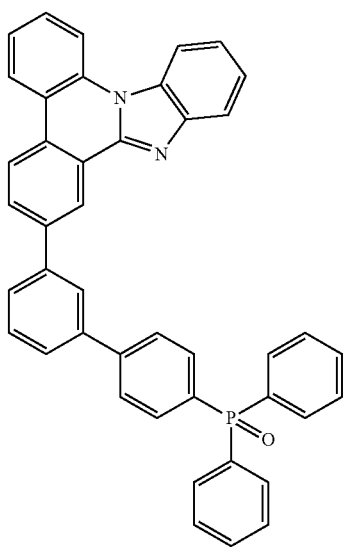
[Formula 1-27]
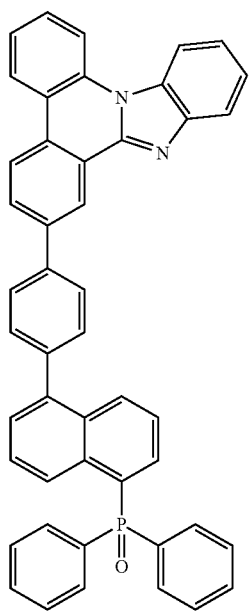

-continued
[Formula 1-31]
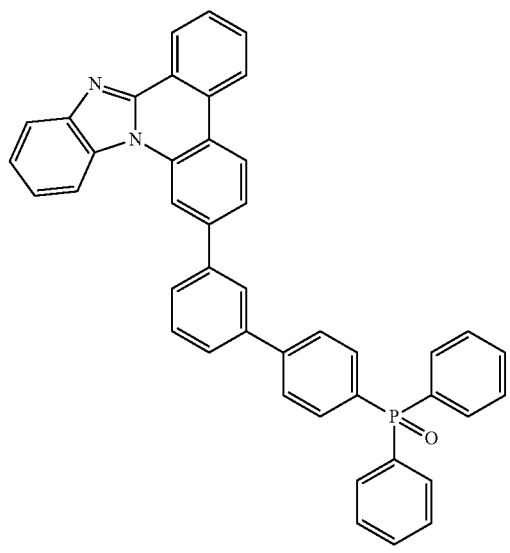
[Formula 1-32]
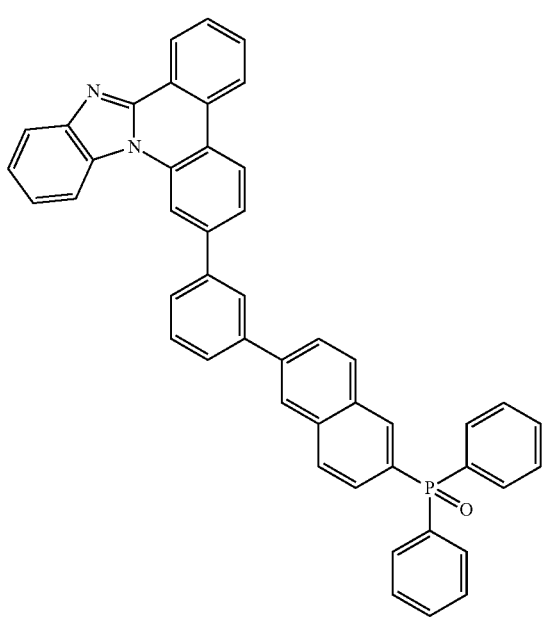
-continued
[Formula 1-34]
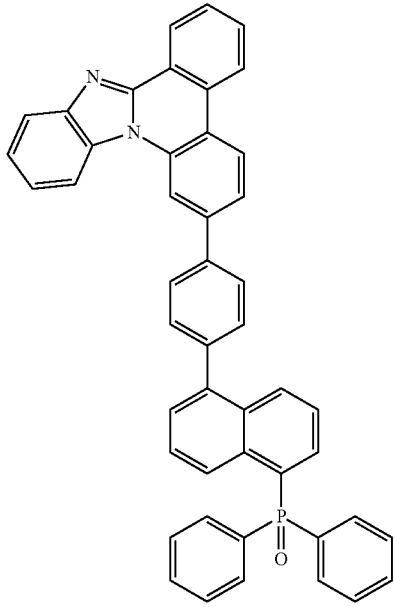
[Formula 1-38]
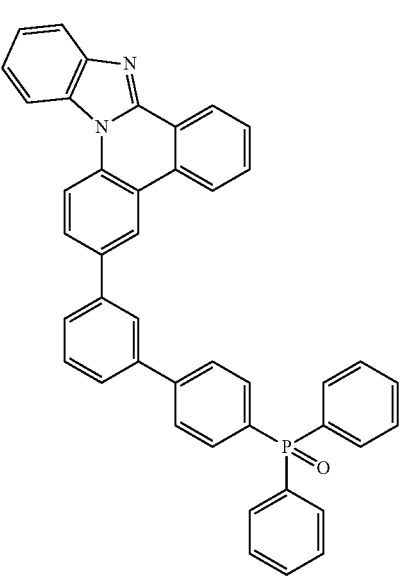

| 97 | 98 |
|---|---|
| -continued | -continued |
[Formula 1-39]
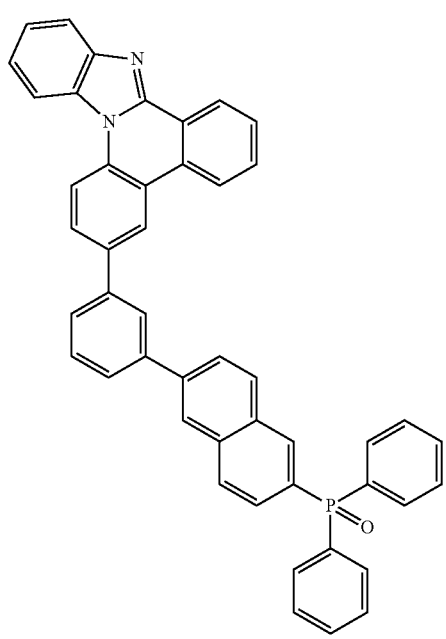
[Formula 1-41]
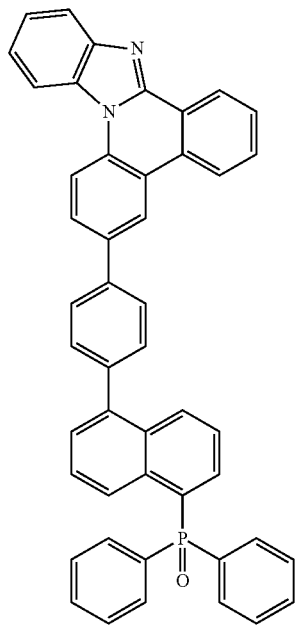
* * * * *